US008053781B2

(12) United States Patent
Suzawa et al.

(10) Patent No.: US 8,053,781 B2
(45) Date of Patent: Nov. 8, 2011

(54) SEMICONDUCTOR DEVICE HAVING THIN FILM TRANSISTOR

(75) Inventors: Hideomi Suzawa, Atsugi (JP);
Yoshihiro Kusuyama, Tochigi (JP);
Shunpei Yamazaki, Setagaya (JP)

(73) Assignee: Semiconductor Energy Laboratory Co., Ltd., Atsugi-shi, Kanagawa-ken (KR)

( * ) Notice: Subject to any disclaimer, the term of this patent is extended or adjusted under 35 U.S.C. 154(b) by 0 days.

(21) Appl. No.: 13/010,089

(22) Filed: Jan. 20, 2011

(65) Prior Publication Data

US 2011/0114959 A1 May 19, 2011

Related U.S. Application Data

(60) Continuation of application No. 12/766,172, filed on Apr. 23, 2010, now Pat. No. 7,875,886, and a continuation of application No. 12/230,043, filed on Aug. 22, 2008, now Pat. No. 7,714,329, and a continuation of application No. 11/298,752, filed on Dec. 12, 2005, now Pat. No. 7,420,209, and a division of application No. 10/086,628, filed on Mar. 4, 2002, now Pat. No. 7,071,037.

(30) Foreign Application Priority Data

Mar. 6, 2001 (JP) .................................. 2001-062677
Mar. 6, 2001 (JP) .................................. 2001-062690

(51) Int. Cl.
*H01L 27/14* (2006.01)
(52) U.S. Cl. .... 257/72; 257/291; 257/774; 257/E51.005
(58) Field of Classification Search ........................ None
See application file for complete search history.

(56) References Cited

U.S. PATENT DOCUMENTS

| 3,967,981 | A | 7/1976 | Yamazaki |
| 4,624,737 | A | 11/1986 | Shimbo |
| 4,730,903 | A | 3/1988 | Yamazaki et al. |
| 4,862,234 | A | 8/1989 | Koden |
| 4,914,503 | A | 4/1990 | Shirato et al. |
| 4,960,719 | A | 10/1990 | Tanaka et al. |

(Continued)

FOREIGN PATENT DOCUMENTS

EP 0629003 A 12/1994

(Continued)

OTHER PUBLICATIONS

Wolf.S et al., Silicon Processing for the VLSI ERA, 1986, vol. 1, pp. 161-175/335, Lattice Press.
Wolf.S et al., "Sputter Deposition Equipment,", Silicon Processing for the VLSI ERA, 1986, vol. 1, pp. 359-365, Lattice Press.

*Primary Examiner* — Alonzo Chambliss
(74) *Attorney, Agent, or Firm* — Eric J. Robinson; Robinson Intellectual Property Law Office, P.C.

(57) ABSTRACT

The present invention has an object to provide an active-matrix liquid crystal display device that realizes the improvement in productivity as well as in yield. In the present invention, a laminate film comprising the conductive film comprising metallic material and the second amorphous semiconductor film containing an impurity element of one conductivity type and the amorphous semiconductor film is selectively etched with the same etching gas to form a side edge of the first amorphous semiconductor film 1001 into a taper shape. Thereby, a coverage problem of a pixel electrode 1003 can be solved and an inverse stagger type TFT can be completed with three photomask. Selected figure is FIG. 15.

30 Claims, 20 Drawing Sheets

U.S. PATENT DOCUMENTS

| | | | |
|---|---|---|---|
| 5,028,551 A | 7/1991 | Dohjo et al. | |
| 5,084,961 A | 2/1992 | Yoshikawa | |
| 5,151,806 A | 9/1992 | Kawamoto et al. | |
| 5,231,039 A | 7/1993 | Sakono et al. | |
| 5,261,156 A | 11/1993 | Mase et al. | |
| 5,311,040 A * | 5/1994 | Hiramatsu et al. | 257/57 |
| 5,346,833 A | 9/1994 | Wu | |
| 5,362,660 A | 11/1994 | Kwasnick et al. | |
| 5,428,250 A | 6/1995 | Ikeda et al. | |
| 5,466,617 A | 11/1995 | Shannon | |
| 5,478,766 A | 12/1995 | Park et al. | |
| 5,491,352 A | 2/1996 | Tsuji | |
| 5,532,180 A | 7/1996 | den Boer et al. | |
| 5,539,219 A | 7/1996 | den Boer et al. | |
| 5,561,074 A | 10/1996 | Koide et al. | |
| 5,561,440 A | 10/1996 | Kitajima et al. | |
| 5,583,675 A | 12/1996 | Yamada et al. | |
| 5,622,814 A | 4/1997 | Miyata et al. | |
| 5,644,147 A | 7/1997 | Yamazaki et al. | |
| 5,648,662 A * | 7/1997 | Zhang et al. | 257/59 |
| 5,668,379 A | 9/1997 | Ono et al. | |
| 5,668,651 A | 9/1997 | Yamada et al. | |
| 5,684,318 A | 11/1997 | Ayres et al. | |
| 5,706,064 A | 1/1998 | Fukunaga et al. | |
| 5,726,461 A * | 3/1998 | Shimada et al. | 257/59 |
| 5,729,312 A | 3/1998 | Yamagishi et al. | |
| 5,734,177 A | 3/1998 | Sakamoto | |
| 5,739,549 A | 4/1998 | Takemura et al. | |
| 5,739,880 A | 4/1998 | Suzuki et al. | |
| 5,739,882 A | 4/1998 | Shimizu et al. | |
| 5,739,887 A | 4/1998 | Ueda et al. | |
| 5,744,820 A | 4/1998 | Matsushima et al. | |
| 5,751,020 A * | 5/1998 | Lyu | 257/72 |
| 5,757,453 A | 5/1998 | Shin et al. | |
| 5,757,456 A | 5/1998 | Yamazaki et al. | |
| 5,760,854 A | 6/1998 | Ono et al. | |
| 5,766,977 A | 6/1998 | Yamazaki | |
| 5,780,872 A | 7/1998 | Misawa et al. | |
| 5,793,072 A | 8/1998 | Kuo | |
| 5,796,121 A | 8/1998 | Gates | |
| 5,798,812 A | 8/1998 | Nishiki et al. | |
| 5,804,501 A | 9/1998 | Kim | |
| 5,811,318 A | 9/1998 | Kweon | |
| 5,811,328 A | 9/1998 | Zhang et al. | |
| 5,811,835 A | 9/1998 | Seiki et al. | |
| 5,811,846 A | 9/1998 | Miura et al. | |
| 5,814,836 A * | 9/1998 | Hyun | 257/72 |
| 5,818,070 A | 10/1998 | Yamazaki et al. | |
| 5,821,138 A | 10/1998 | Yamazaki et al. | |
| 5,821,622 A | 10/1998 | Tsuji et al. | |
| 5,825,449 A | 10/1998 | Shin | |
| 5,828,433 A | 10/1998 | Shin | |
| 5,830,785 A | 11/1998 | Sanson et al. | |
| 5,834,327 A | 11/1998 | Yamazaki et al. | |
| 5,838,400 A | 11/1998 | Ueda et al. | |
| 5,844,643 A | 12/1998 | Onishi et al. | |
| 5,847,687 A | 12/1998 | Hirakata et al. | |
| 5,849,601 A | 12/1998 | Yamazaki | |
| 5,852,487 A | 12/1998 | Fujimori et al. | |
| 5,867,233 A | 2/1999 | Tanaka | |
| 5,872,611 A | 2/1999 | Hirata et al. | |
| 5,874,326 A | 2/1999 | Lyu | |
| 5,880,794 A | 3/1999 | Hwang | |
| 5,888,855 A | 3/1999 | Nagahisa et al. | |
| 5,889,291 A | 3/1999 | Koyama et al. | |
| 5,892,562 A | 4/1999 | Yamazaki et al. | |
| 5,899,547 A | 5/1999 | Yamazaki et al. | |
| 5,903,326 A | 5/1999 | Lee | |
| 5,907,380 A | 5/1999 | Lien | |
| 5,917,564 A | 6/1999 | Kim et al. | |
| 5,917,567 A | 6/1999 | Oh et al. | |
| 5,940,154 A | 8/1999 | Ukita et al. | |
| 5,942,767 A | 8/1999 | Na et al. | |
| 5,943,559 A | 8/1999 | Maeda | |
| 5,953,093 A | 9/1999 | Hirata et al. | |
| 5,959,599 A | 9/1999 | Hirakata | |
| 5,966,189 A | 10/1999 | Matsuo | |
| 5,968,850 A | 10/1999 | Jeong et al. | |
| 5,977,562 A | 11/1999 | Hirakata et al. | |
| 5,981,972 A | 11/1999 | Kawai et al. | |
| 5,986,724 A | 11/1999 | Akiyama et al. | |
| 5,990,998 A | 11/1999 | Park et al. | |
| 5,994,721 A | 11/1999 | Zhong et al. | |
| 5,995,190 A | 11/1999 | Nagae et al. | |
| 5,998,229 A | 12/1999 | Lyu et al. | |
| 5,998,230 A | 12/1999 | Gee-Sung et al. | |
| 6,008,065 A | 12/1999 | Lee et al. | |
| 6,008,869 A | 12/1999 | Oana et al. | |
| 6,020,598 A | 2/2000 | Yamazaki | |
| 6,025,216 A | 2/2000 | Ha | |
| 6,025,891 A | 2/2000 | Kim | |
| 6,025,892 A | 2/2000 | Kawai et al. | |
| 6,037,017 A | 3/2000 | Kashiro | |
| 6,038,003 A | 3/2000 | Kim | |
| 6,055,028 A | 4/2000 | Nishi et al. | |
| 6,061,112 A | 5/2000 | Ukita et al. | |
| 6,064,358 A | 5/2000 | Kitajima et al. | |
| 6,064,456 A | 5/2000 | Taniguchi et al. | |
| 6,067,141 A | 5/2000 | Yamada et al. | |
| 6,072,556 A | 6/2000 | Hirakata et al. | |
| 6,072,557 A | 6/2000 | Kishimoto | |
| 6,075,257 A | 6/2000 | Song | |
| 6,097,458 A | 8/2000 | Tsuda et al. | |
| 6,097,459 A | 8/2000 | Shimada et al. | |
| 6,097,465 A | 8/2000 | Hiroki et al. | |
| 6,114,184 A | 9/2000 | Matsumoto et al. | |
| 6,118,502 A | 9/2000 | Yamazaki et al. | |
| 6,124,155 A | 9/2000 | Zhang et al. | |
| 6,124,604 A | 9/2000 | Koyama et al. | |
| 6,124,606 A | 9/2000 | den Boer et al. | |
| 6,130,443 A | 10/2000 | Hong et al. | |
| 6,130,729 A | 10/2000 | Oh et al. | |
| 6,133,977 A | 10/2000 | Lee et al. | |
| 6,140,158 A | 10/2000 | Rhee et al. | |
| 6,141,077 A | 10/2000 | Hirata et al. | |
| 6,153,893 A | 11/2000 | Inoue et al. | |
| 6,160,600 A | 12/2000 | Yamazaki et al. | |
| 6,166,396 A | 12/2000 | Yamazaki | |
| 6,166,399 A | 12/2000 | Zhang et al. | |
| 6,172,728 B1 | 1/2001 | Hiraishi | |
| 6,177,968 B1 | 1/2001 | Okada et al. | |
| 6,184,946 B1 | 2/2001 | Ando et al. | |
| 6,188,452 B1 | 2/2001 | Kim et al. | |
| 6,190,933 B1 | 2/2001 | Shimabukuro et al. | |
| 6,197,625 B1 | 3/2001 | Choi | |
| 6,198,133 B1 | 3/2001 | Yamazaki et al. | |
| 6,208,390 B1 | 3/2001 | Ejiri et al. | |
| 6,208,395 B1 | 3/2001 | Kanoh et al. | |
| 6,215,541 B1 | 4/2001 | Song et al. | |
| 6,218,221 B1 | 4/2001 | Sah | |
| 6,222,603 B1 | 4/2001 | Sakai et al. | |
| 6,235,561 B1 | 5/2001 | Seiki et al. | |
| 6,239,854 B1 | 5/2001 | Hirakata et al. | |
| 6,243,064 B1 | 6/2001 | Hirakata | |
| 6,255,668 B1 | 7/2001 | Kang et al. | |
| 6,265,889 B1 | 7/2001 | Tomita et al. | |
| 6,266,117 B1 | 7/2001 | Yanagawa et al. | |
| 6,266,121 B1 | 7/2001 | Shigeta et al. | |
| 6,266,122 B1 | 7/2001 | Kishimoto et al. | |
| 6,268,617 B1 | 7/2001 | Hirakata et al. | |
| 6,271,903 B1 | 8/2001 | Shin et al. | |
| 6,287,899 B1 | 9/2001 | Park et al. | |
| 6,297,519 B1 | 10/2001 | Fujikawa et al. | |
| 6,304,243 B1 | 10/2001 | Kondo et al. | |
| 6,317,187 B1 | 11/2001 | Nakajima et al. | |
| 6,323,051 B1 | 11/2001 | Shimada | |
| 6,330,049 B1 | 12/2001 | Kume et al. | |
| 6,331,845 B1 | 12/2001 | Kitajima et al. | |
| 6,331,881 B1 | 12/2001 | Hatano et al. | |
| 6,335,213 B1 | 1/2002 | Zhang et al. | |
| 6,339,462 B1 | 1/2002 | Kishimoto et al. | |
| 6,341,002 B1 | 1/2002 | Shimizu et al. | |
| 6,342,939 B1 | 1/2002 | Hirata et al. | |
| 6,359,672 B2 | 3/2002 | Gu et al. | |
| 6,362,866 B1 | 3/2002 | Yamazaki et al. | |
| 6,365,933 B1 | 4/2002 | Yamazaki et al. | |
| 6,368,485 B1 | 4/2002 | Ue et al. | |

| | | |
|---|---|---|
| 6,384,818 B1 | 5/2002 | Yamazaki et al. |
| 6,387,737 B1 | 5/2002 | Yamazaki et al. |
| 6,407,431 B2 | 6/2002 | Yamazaki et al. |
| 6,411,358 B2 | 6/2002 | Song et al. |
| 6,429,057 B1 | 8/2002 | Hong et al. |
| 6,433,842 B1 | 8/2002 | Kaneko et al. |
| 6,437,844 B1 | 8/2002 | Hattori et al. |
| 6,441,399 B1 | 8/2002 | Koyama et al. |
| 6,456,269 B2 | 9/2002 | Hirakata |
| 6,462,802 B1 | 10/2002 | Nishimura et al. |
| 6,465,268 B2 | 10/2002 | Hirakata et al. |
| 6,466,289 B1 | 10/2002 | Lee et al. |
| 6,493,050 B1 | 12/2002 | Lien et al. |
| 6,498,634 B1 | 12/2002 | Yamazaki et al. |
| 6,507,045 B2 * | 1/2003 | Gu et al. ............ 257/72 |
| 6,519,018 B1 | 2/2003 | Samant et al. |
| 6,528,357 B2 | 3/2003 | Dojo et al. |
| 6,529,256 B1 | 3/2003 | Seo |
| 6,531,392 B2 | 3/2003 | Song et al. |
| 6,567,146 B2 | 5/2003 | Hirakata et al. |
| 6,583,065 B1 | 6/2003 | Williams et al. |
| 6,587,162 B1 | 7/2003 | Kaneko et al. |
| 6,599,791 B1 | 7/2003 | Koyama et al. |
| 6,611,309 B2 | 8/2003 | Park et al. |
| 6,617,644 B1 | 9/2003 | Yamazaki et al. |
| 6,621,102 B2 | 9/2003 | Hirakata et al. |
| 6,624,864 B1 | 9/2003 | Kubo et al. |
| 6,630,977 B1 | 10/2003 | Yamazaki et al. |
| 6,642,074 B2 | 11/2003 | Hong et al. |
| 6,661,488 B1 | 12/2003 | Takeda et al. |
| 6,671,025 B1 | 12/2003 | Ikeda et al. |
| 6,697,129 B1 | 2/2004 | Nishi et al. |
| 6,709,901 B1 | 3/2004 | Yamazaki et al. |
| 6,743,650 B2 | 6/2004 | Hirakata et al. |
| 6,747,288 B2 | 6/2004 | Yamazaki et al. |
| 6,756,258 B2 | 6/2004 | Zhang et al. |
| 6,762,082 B2 | 7/2004 | Yamazaki et al. |
| 6,762,813 B1 | 7/2004 | Zhang et al. |
| 6,771,342 B2 | 8/2004 | Hirakata et al. |
| 6,774,974 B1 | 8/2004 | Matsuyama |
| 6,787,809 B2 | 9/2004 | Hong et al. |
| 6,797,548 B2 | 9/2004 | Zhang et al. |
| 6,806,495 B1 | 10/2004 | Yamazaki et al. |
| 6,806,499 B2 | 10/2004 | Yamazaki et al. |
| 6,806,937 B2 | 10/2004 | Park et al. |
| 6,847,064 B2 | 1/2005 | Zhang et al. |
| 6,855,957 B1 | 2/2005 | Yamazaki et al. |
| 6,856,360 B1 | 2/2005 | Higuchi et al. |
| 6,856,372 B2 | 2/2005 | Song et al. |
| 6,861,670 B1 | 3/2005 | Ohtani et al. |
| 6,873,312 B2 | 3/2005 | Matsueda |
| 6,900,084 B1 | 5/2005 | Yamazaki |
| 6,911,962 B1 | 6/2005 | Hirakata et al. |
| 6,914,655 B2 | 7/2005 | Yamazaki et al. |
| 6,933,989 B2 | 8/2005 | Oke et al. |
| 6,950,168 B2 | 9/2005 | Yamazaki et al. |
| 7,016,003 B2 | 3/2006 | Hirakata et al. |
| 7,019,329 B2 | 3/2006 | Yamazaki et al. |
| 7,071,037 B2 * | 7/2006 | Suzawa et al. ............ 438/151 |
| 7,078,255 B2 | 7/2006 | Hong et al. |
| 7,102,165 B2 | 9/2006 | Yamazaki |
| 7,102,718 B1 | 9/2006 | Yamazaki et al. |
| 7,145,173 B2 | 12/2006 | Koyama et al. |
| 7,166,862 B2 | 1/2007 | Koyama et al. |
| 7,202,497 B2 | 4/2007 | Ohtani et al. |
| 7,235,810 B1 | 6/2007 | Yamazaki et al. |
| 7,259,427 B2 | 8/2007 | Yamazaki et al. |
| 7,279,711 B1 | 10/2007 | Yamazaki et al. |
| 7,317,438 B2 | 1/2008 | Yamazaki et al. |
| 7,323,715 B2 | 1/2008 | Yamazaki |
| 7,403,238 B2 | 7/2008 | Higuchi et al. |
| 7,414,266 B2 | 8/2008 | Yamazaki et al. |
| 7,420,209 B2 * | 9/2008 | Suzawa et al. ............ 257/59 |
| 7,507,991 B2 | 3/2009 | Zhang et al. |
| 7,511,776 B2 | 3/2009 | Nishi et al. |
| 7,652,294 B2 | 1/2010 | Yamazaki et al. |
| 7,656,491 B2 | 2/2010 | Yamazaki et al. |
| 7,687,325 B2 | 3/2010 | Yamazaki et al. |
| 7,705,354 B2 | 4/2010 | Yamazaki et al. |
| 7,714,329 B2 * | 5/2010 | Suzawa et al. ............ 257/59 |
| 7,714,975 B1 | 5/2010 | Yamazaki et al. |
| 7,728,334 B2 | 6/2010 | Yamazaki et al. |
| 7,875,886 B2 * | 1/2011 | Suzawa et al. ............ 257/59 |
| 2004/0207789 A1 | 10/2004 | Hirakata et al. |
| 2004/0218112 A1 | 11/2004 | Hirakata et al. |
| 2004/0257511 A1 | 12/2004 | Song et al. |
| 2005/0082536 A1 | 4/2005 | Park et al. |
| 2005/0098894 A1 | 5/2005 | Ohtani et al. |
| 2006/0081931 A1 | 4/2006 | Yamazaki et al. |
| 2006/0228821 A1 | 10/2006 | Hong et al. |
| 2007/0146568 A1 | 6/2007 | Yamazaki et al. |
| 2009/0033818 A1 | 2/2009 | Nakajima et al. |

FOREIGN PATENT DOCUMENTS

| | | |
|---|---|---|
| EP | 0678907 B | 10/1995 |
| EP | 1001467 A | 5/2000 |
| EP | 1006589 A | 6/2000 |
| EP | 1041622 A | 10/2000 |
| JP | 01-210989 A | 8/1989 |
| JP | 05-034717 A | 2/1993 |
| JP | 05-119331 A | 5/1993 |
| JP | 05-142558 A | 6/1993 |
| JP | 05-175500 A | 7/1993 |
| JP | 05-265020 A | 10/1993 |
| JP | 05-323371 A | 12/1993 |
| JP | 06-045354 A | 2/1994 |
| JP | 06-082754 A | 3/1994 |
| JP | 06-148683 A | 5/1994 |
| JP | 06-194615 A | 7/1994 |
| JP | 07-014880 A | 1/1995 |
| JP | 07-159776 A | 6/1995 |
| JP | 07-191348 A | 7/1995 |
| JP | 07-318975 A | 12/1995 |
| JP | 08-087030 A | 4/1996 |
| JP | 08-087033 A | 4/1996 |
| JP | 09-005767 A | 1/1997 |
| JP | 09-015621 A | 1/1997 |
| JP | 09-054318 A | 2/1997 |
| JP | 09-152626 A | 6/1997 |
| JP | 09-153618 A | 6/1997 |
| JP | 09-274444 A | 10/1997 |
| JP | 10-048651 A | 2/1998 |
| JP | 10-048663 A | 2/1998 |
| JP | 10-123574 A | 5/1998 |
| JP | 10-135469 A | 5/1998 |
| JP | 10-221704 A | 8/1998 |
| JP | 11-103067 A | 4/1999 |
| JP | 11-109372 A | 4/1999 |
| JP | 11-133455 A | 5/1999 |
| JP | 11-160732 A | 6/1999 |
| JP | 11-160734 A | 6/1999 |
| JP | 11-160735 A | 6/1999 |
| JP | 11-202368 A | 7/1999 |
| JP | 11-258596 A | 9/1999 |
| JP | 11-258625 A | 9/1999 |
| JP | 11-337978 A | 12/1999 |
| JP | 2000-075302 A | 3/2000 |
| JP | 2000-341242 A | 12/2000 |
| JP | 2001-005035 A | 1/2001 |
| JP | 2001-085698 A | 3/2001 |
| JP | 2001-250953 A | 9/2001 |
| JP | 2001-255560 A | 9/2001 |
| JP | 2001-257359 A | 9/2001 |
| JP | 2001-264804 A | 9/2001 |
| JP | 2001-264807 A | 9/2001 |
| JP | 2001-318626 A | 11/2001 |
| KR | 1997-0024311 A | 5/1997 |
| KR | 1998-0072232 A | 11/1998 |
| KR | 0161466 B | 1/1999 |
| KR | 1999-0011210 A | 2/1999 |
| KR | 0180323 B | 4/1999 |
| KR | 1999-0063319 A | 7/1999 |
| KR | 1999-0074563 A | 10/1999 |
| KR | 1999-0075407 A | 10/1999 |
| KR | 2000-0033515 A | 6/2000 |

* cited by examiner

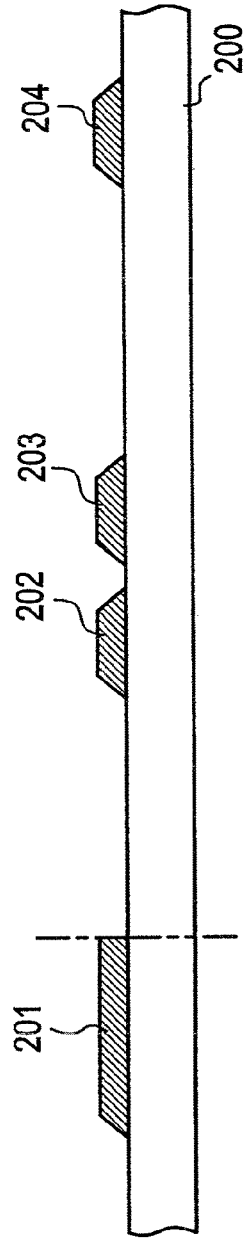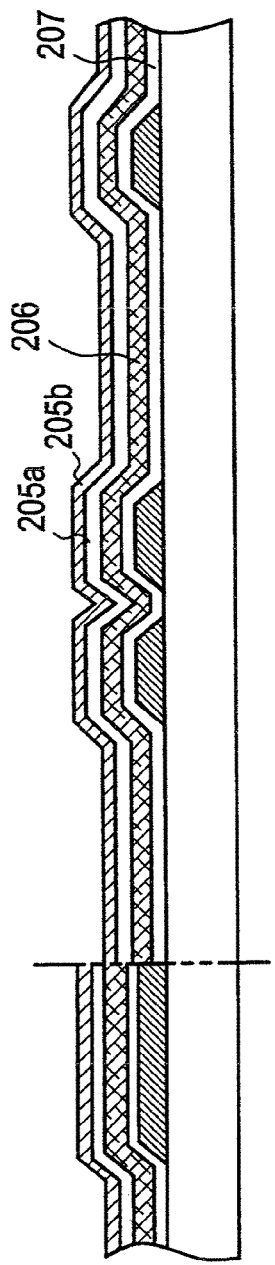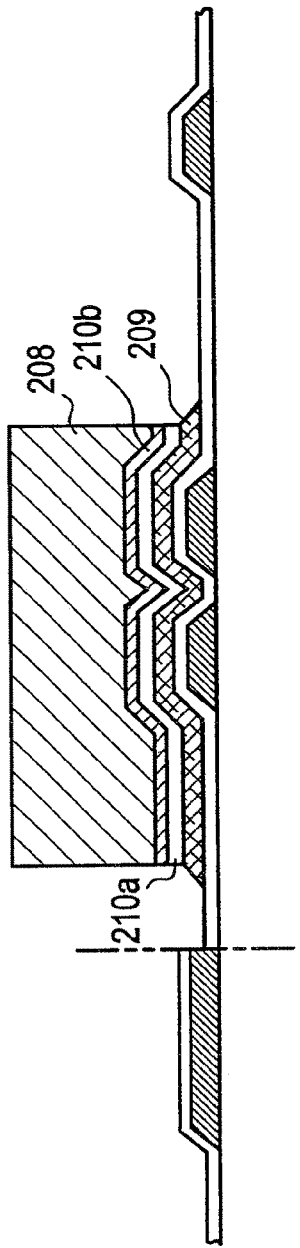

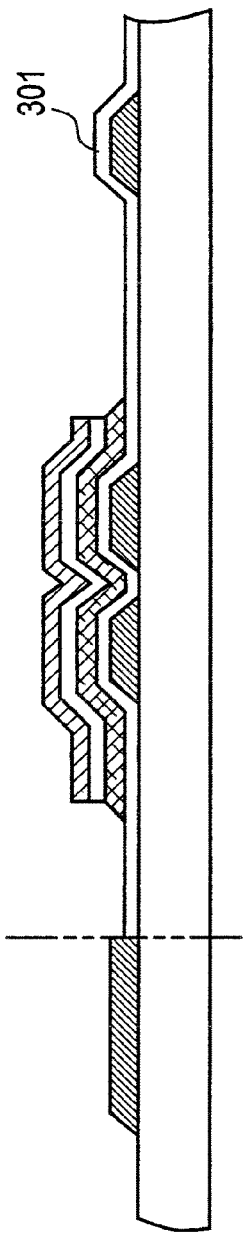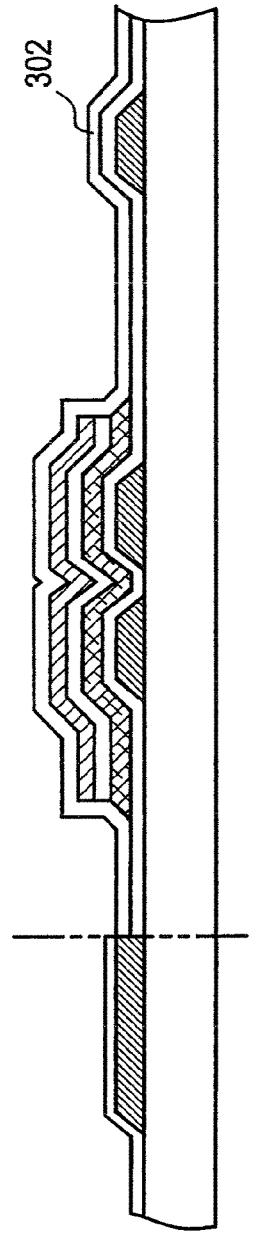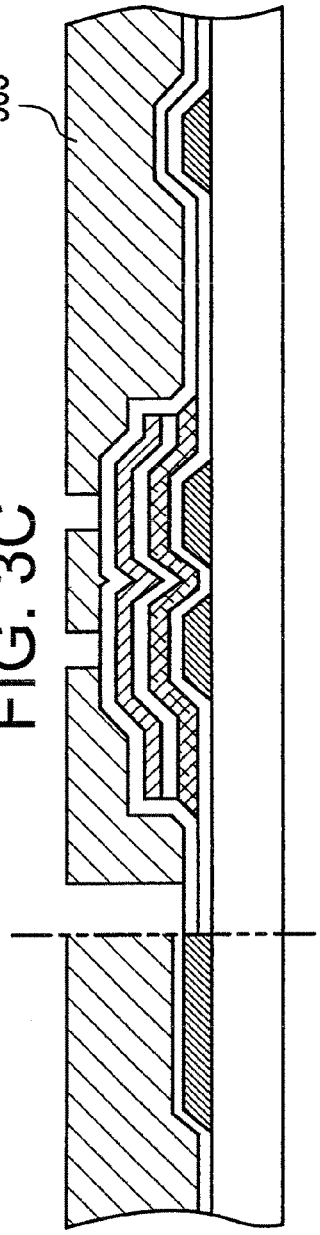

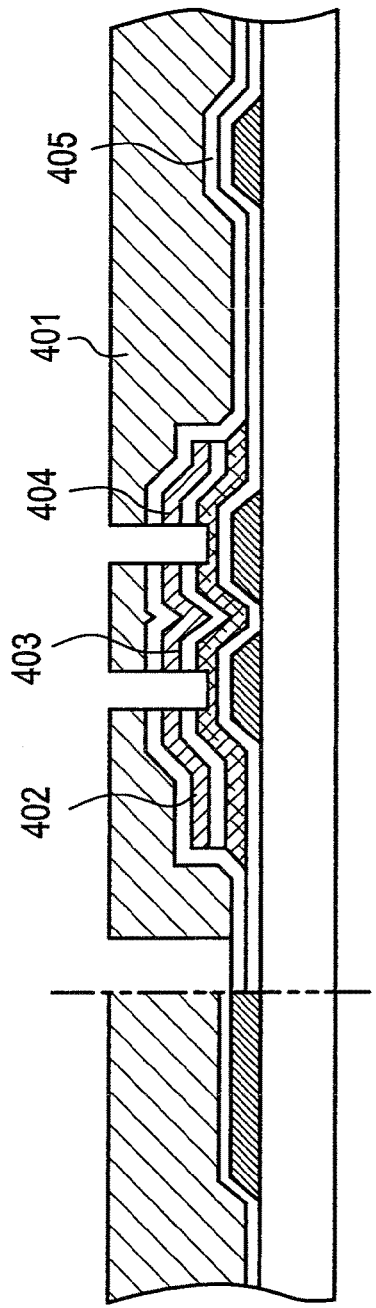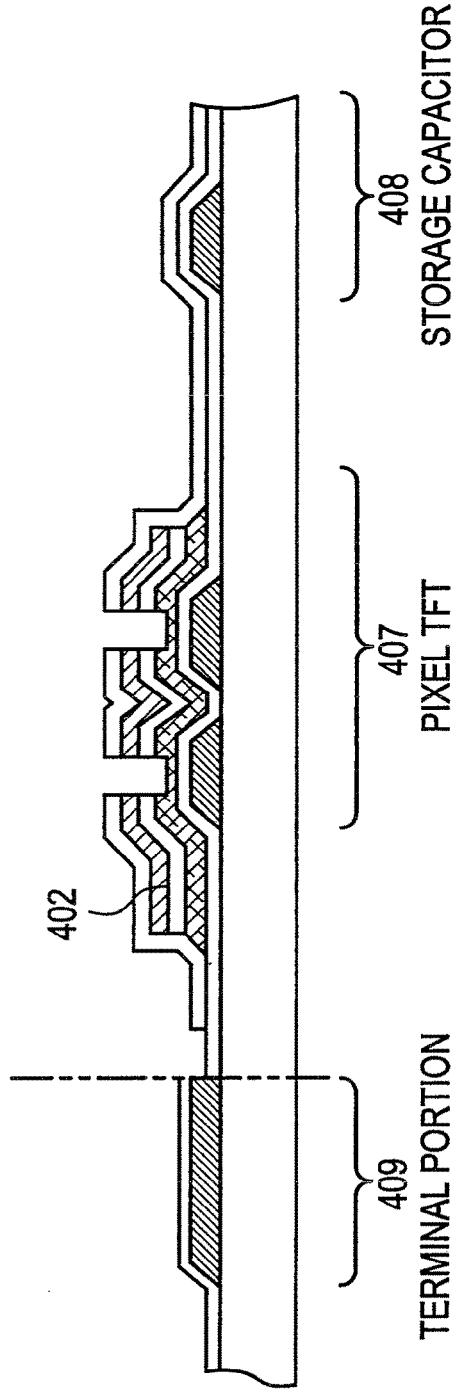

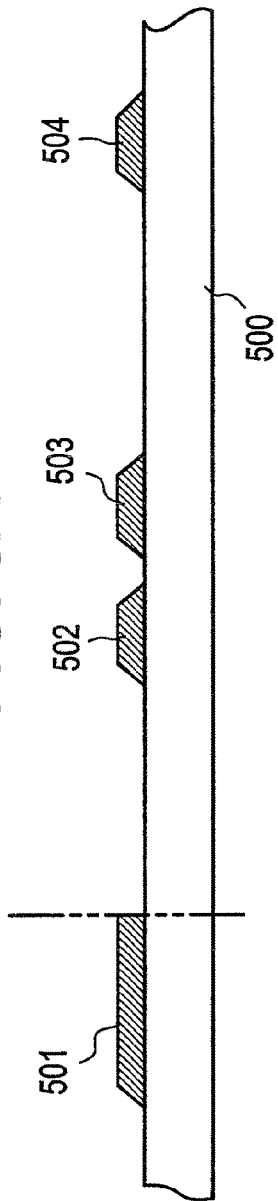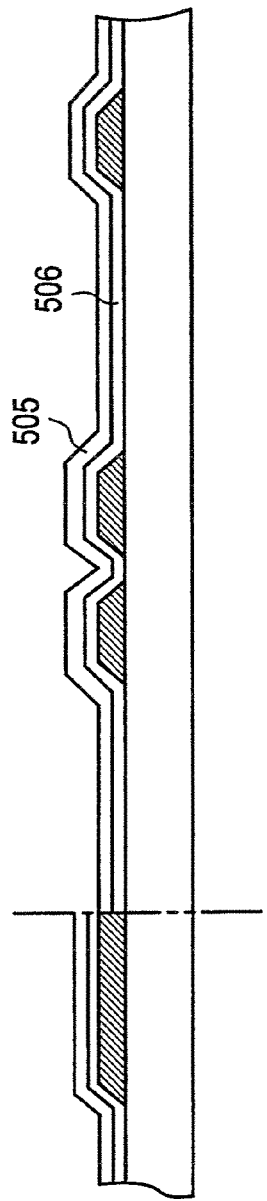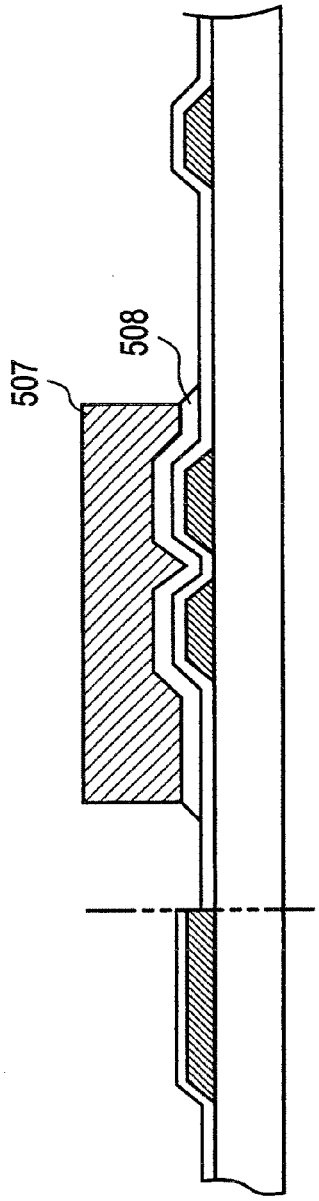

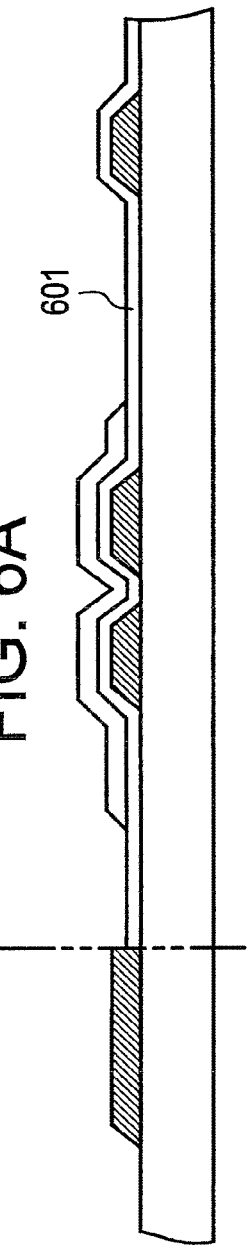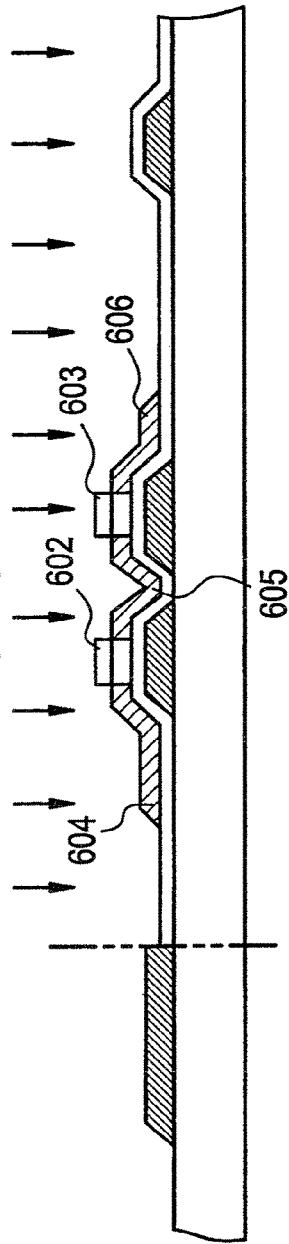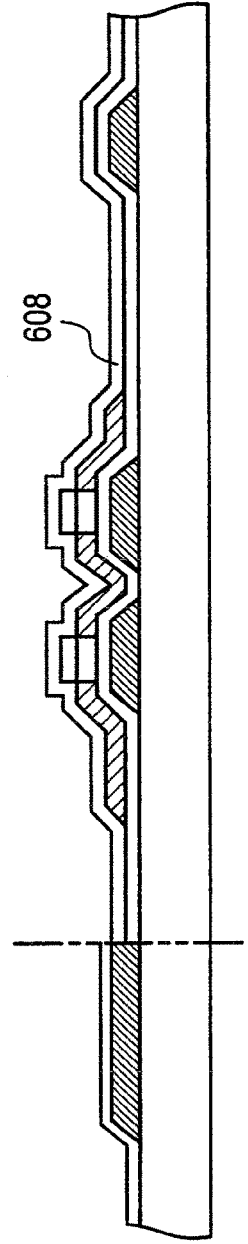

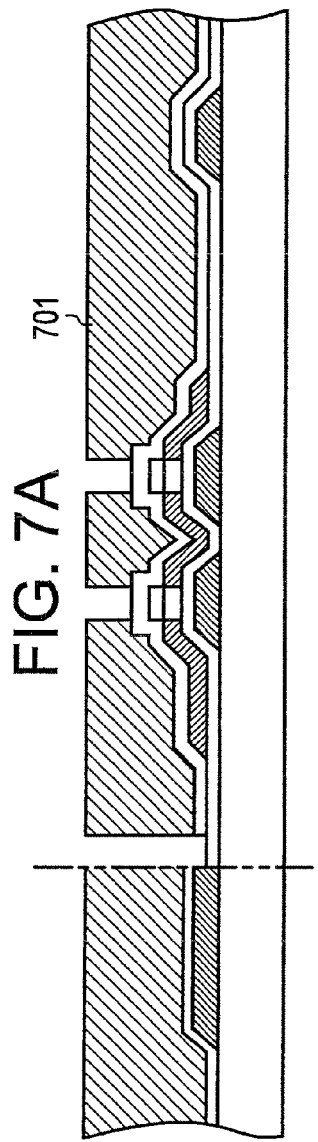
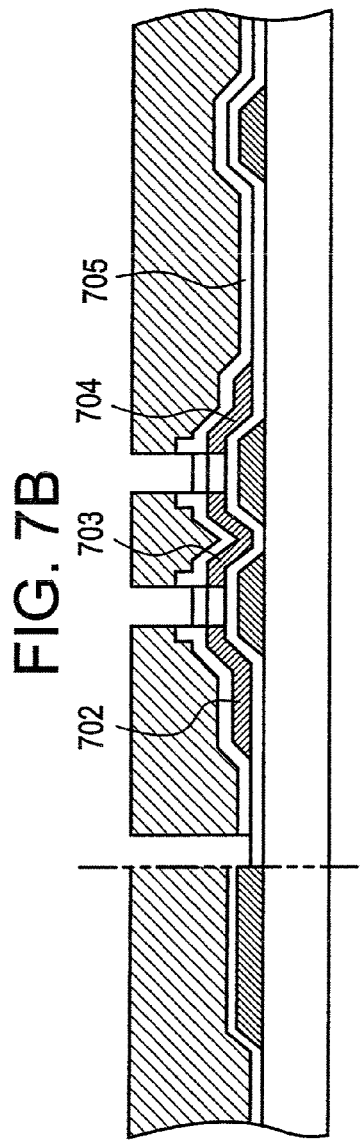
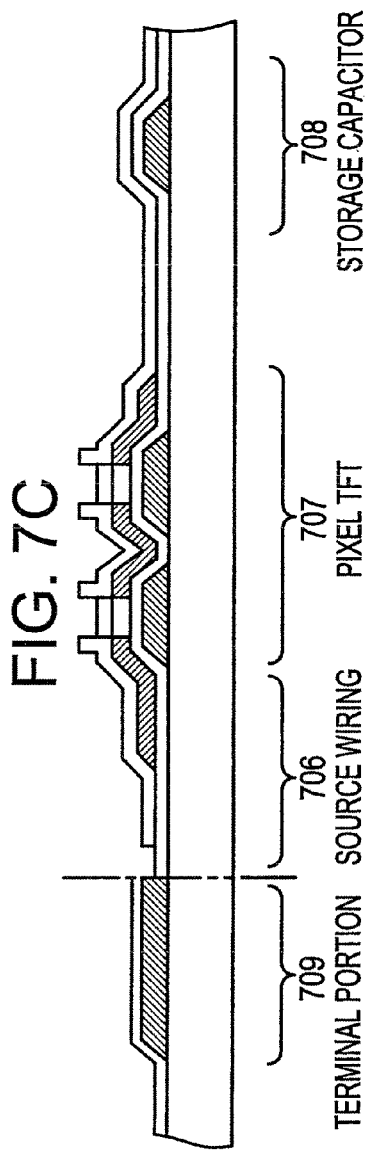

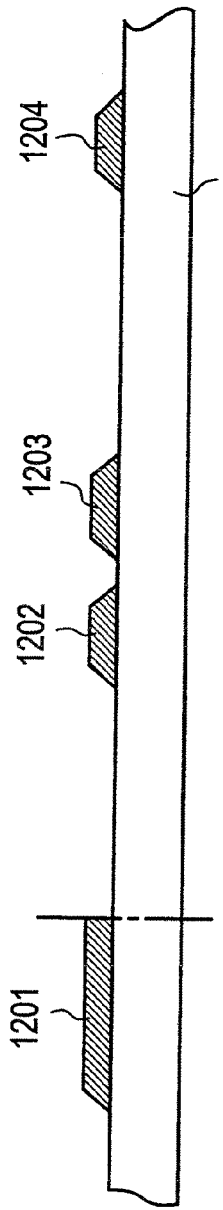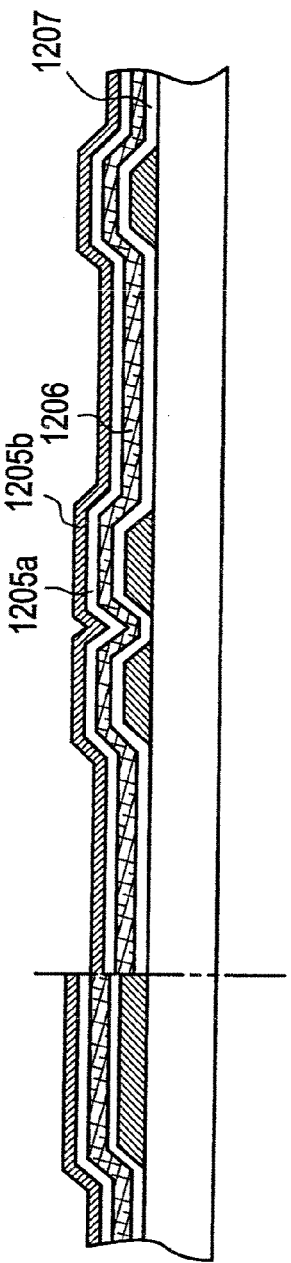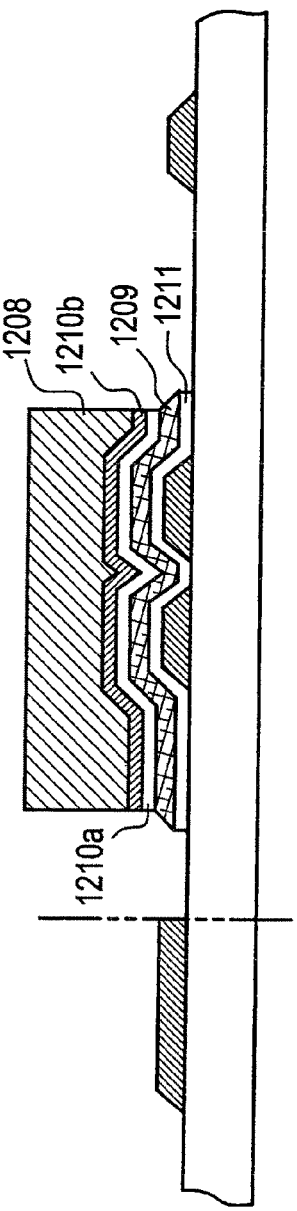

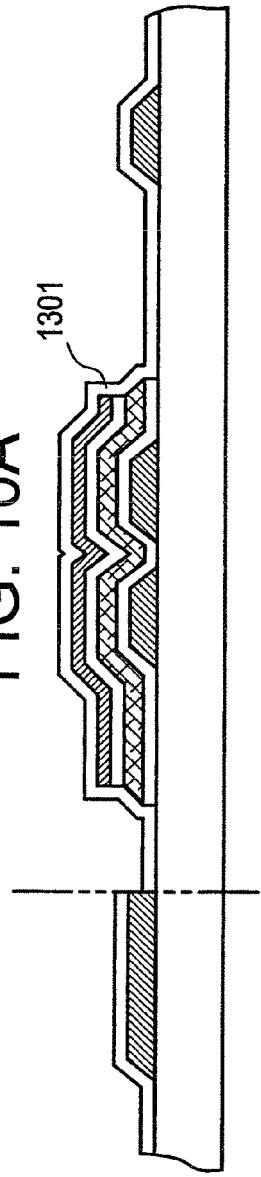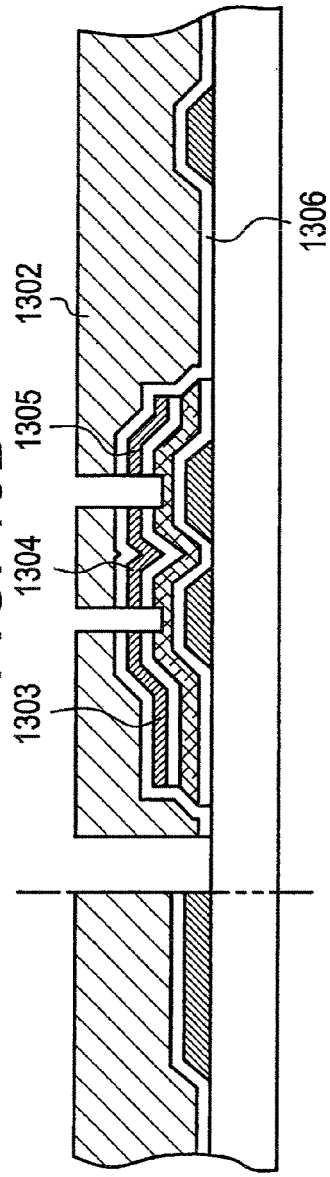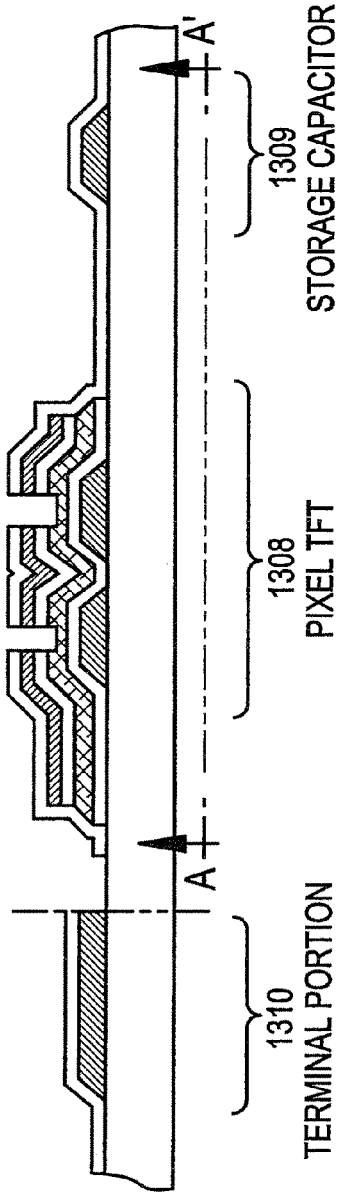

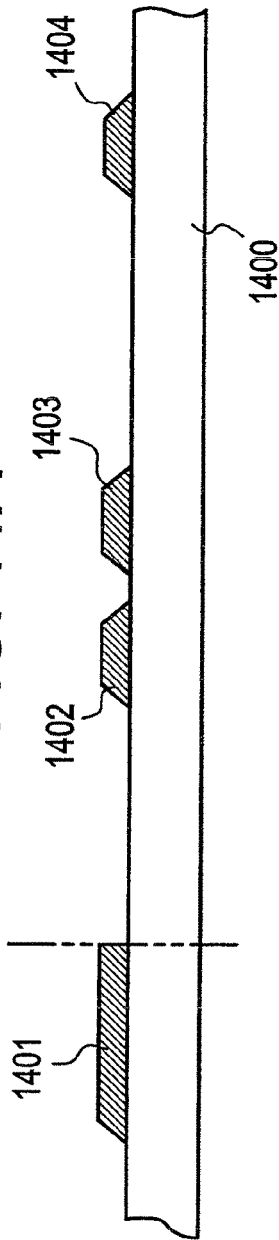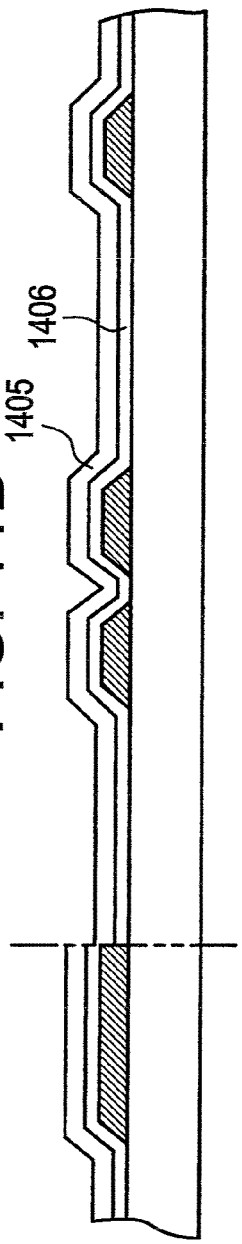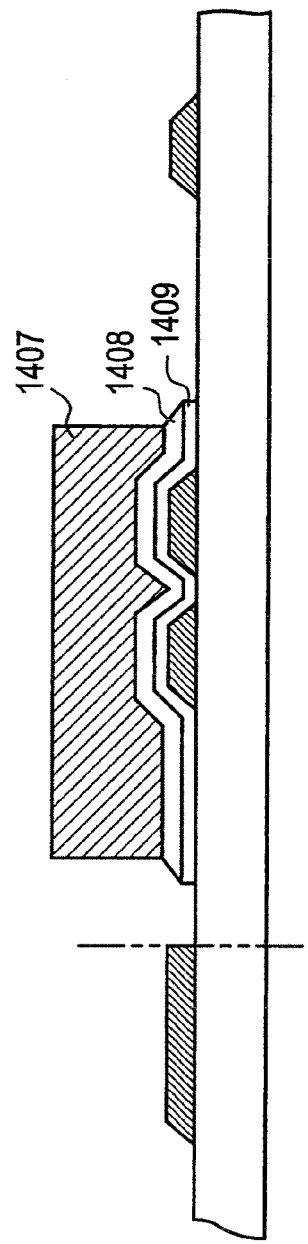

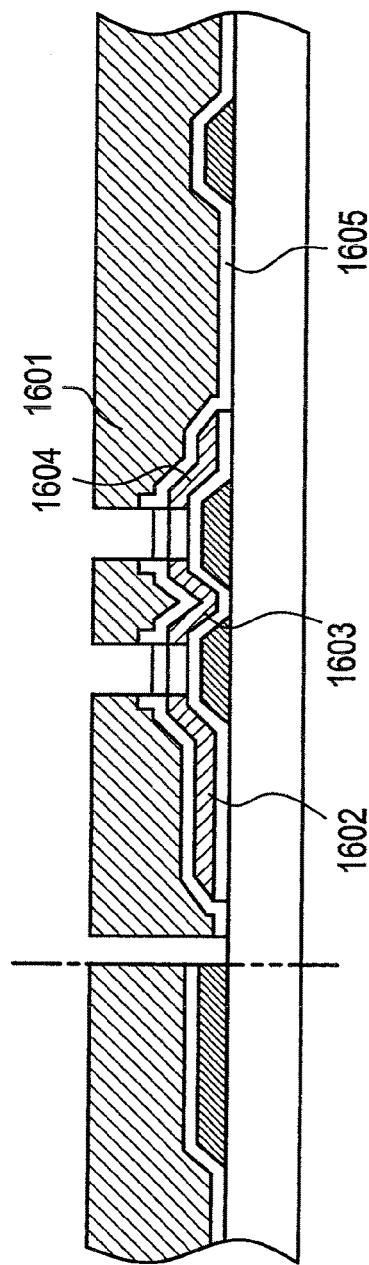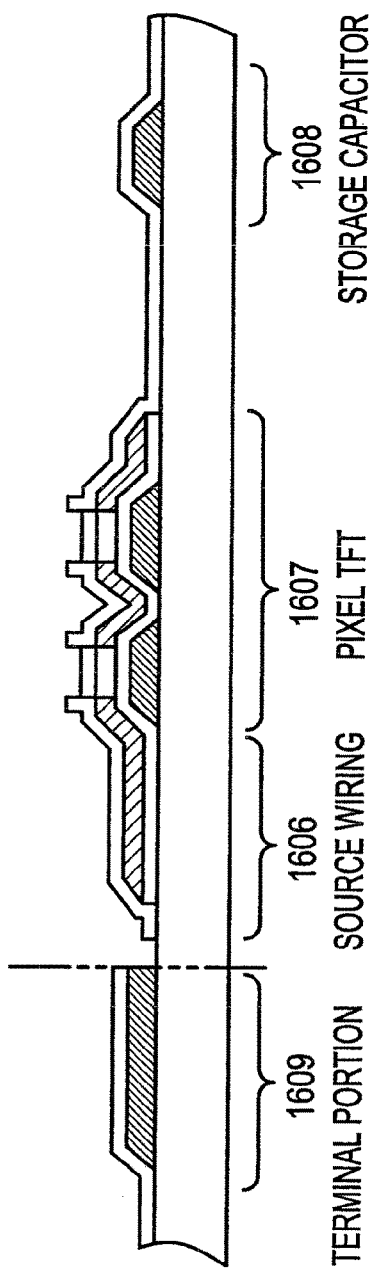

X 50000

SEMICONDUCTOR DEVICE HAVING THIN FILM TRANSISTOR

BACKGROUND OF THE INVENTION

1. Field of the Invention

The present invention relates to a semiconductor device including a semiconductor circuit constituted of a thin-film transistor (hereinafter, abbreviated as a TFT) and a manufacturing method thereof. More particularly, the present invention relates to an electro-optical device as represented by a liquid crystal display panel and an electronic device including such an electro-optical device as a constituent.

Throughout the specification, the term "semiconductor device" indicates all devices that utilize the semiconductor characteristics to function; electro-optical devices (hereinafter, referred to as display devices), semiconductor circuits and electronic devices are all included in the category of the semiconductor devices.

2. Description of the Related Art

Recently, there has been developed a technique for manufacturing a TFT by using a thin semiconductor film (with a thickness of about hundreds to thousands of nm) formed on a substrate which has an insulating surface. The TFT is widely applied to semiconductor devices such as an integrated circuit (IC) or an electro-optical device, and is urgently expected to be developed as, in particular, a switching element for a display device or the like.

An active-matrix liquid crystal display device is frequently used as a semiconductor device because images with high definition can be obtained as compared with a passive liquid crystal display device. The active-matrix liquid crystal display device includes: a gate wiring; a source wiring; a TFT in a pixel portion, which is provided at the cross point of the gate wiring and the source wiring; and a pixel electrode connected to the TFT in the pixel portion.

An amorphous silicon film is used as an amorphous semiconductor film for a conventional TFT because the amorphous silicon film can be formed on a large substrate at a low temperature of 300° C. or less. An inverse-stagger type TFT having a channel formation region formed of an amorphous semiconductor film is widely used.

Conventionally, a TFT is formed on a substrate by using five or more photomasks through a photolithography technique in an active-matrix electric device. The reduction of the number of manufacturing steps is believed to be effective to improve the productivity and the yield.

For the reduction of the number of manufacturing steps, it is necessary to reduce the number of photomasks used in the manufacture of the TFT. With the use of one photomask, the steps of resist application, prebaking, exposure, development, postbaking and the like, the preceding and following steps of forming a coating film, etching and the like, and, furthermore, the step of resist removal, washing and drying, are inevitably added to complicate the manufacture of the TFT.

SUMMARY OF THE INVENTION

The present invention has been made to cope with the above problem, and has an object of reducing the number of photomasks used for manufacturing a TFT in an active-matrix liquid crystal display device so as to realize the improvement in productivity and yield.

Moreover, the present invention has another object of solving a problem of poor coverage of a pixel electrode at the end of a pixel TFT, which generally occurs with the reduction of the number of photomasks, and of providing a structure for preventing an insulating film from being etched during the etching of an amorphous semiconductor film and a manufacturing method thereof.

The present invention is characterized in that the manufacturing steps from the step of forming a conductive film for forming a gate wiring and a capacitance wiring and a terminal electrode to the step of forming a pixel electrode are carried out with three photomasks so as to solve the problem of poor coverage of a pixel electrode and to prevent an insulating film from being etched during the etching of an amorphous semiconductor film.

The three photomasks are respectively characterized as follows:

the first photomask is for forming a conductive film;

the second photomask is for forming a first amorphous semiconductor film and a second amorphous semiconductor film containing an impurity element with one conductivity type (n-type or p-type); and the third photomask is for forming a pixel electrode, a source region, a drain region, a source electrode and a drain electrode, and for channel etching.

According to a constitution of a manufacturing method disclosed in the present specification, a method of manufacturing a semiconductor device comprising:

a first step of forming a gate wiring over an insulating surface;

a second step of forming an insulating film covering said insulating surface and said gate wiring;

a third step of forming a first amorphous semiconductor film over the insulating film;

a fourth step of forming a second amorphous semiconductor film containing an impurity element of one conductivity type over the first amorphous semiconductor film;

a fifth step of forming a conductive film comprising a metallic material over the second amorphous semiconductor film;

a sixth step of forming an side edge of the first amorphous semiconductor film into a taper shape by etching the first amorphous semiconductor film and the second amorphous semiconductor film and the conductive film;

a seventh step of forming a transparent conductive film over the conductive film;

an eighth step of etching a part of the first amorphous semiconductor film and the second amorphous semiconductor film and the conductive film and the transparent conductive film to expose a part of the first amorphous semiconductor film and to form a pixel electrode formed from the transparent conductive film, a source wiring formed from the conductive film, source region and drain region formed from the second amorphous semiconductor film.

In the sixth step, the conductive film and the second amorphous semiconductor film and the first amorphous semiconductor film are etched by chlorine group gas.

A TFT manufactured by utilizing the present invention is shown in FIG. 15. In the present invention, the ends of a first amorphous semiconductor film 1001 are tapered so as to improve the coverage. In order to taper the ends of the first amorphous semiconductor film 1001, by etching the first amorphous semiconductor film 1001 using an etching gas of chlorine group while etching the metallic layer 1002a to form source electrode and drain electrode (and the second amorphous semiconductor film 1002b for forming source region and drain region), only side edges of the first amorphous semiconductor film 1001 can be formed into taper shape. Ultimately, an inverse-stagger TFT in which coverage defect of a pixel electrode 1003 has been solved can be manufactured with three photomasks in total. Moreover, when the amorphous semiconductor film is to be etched, it is possible to prevent an insulating film 1004 from etching in the vicinity of the ends of the first amorphous semiconductor film 1001.

In this way, in the present invention, a multilayer film (metal film, second amorphous semiconductor film and first amorphous semiconductor film) comprising a plurality of different materials is etched at a time using the same etching gas (chlorine group) with a second photomask to improve throughput.

Herein, a tapered shape angle (taper angle) of the first amorphous semiconductor film 1001 is defined as an angle formed by the surface of a substrate and an inclined portion of the end of the first amorphous semiconductor film (FIG. 21B). As shown in FIG. 21A, a taper angle of the end of the first amorphous semiconductor film can be controlled to fall within the range of 5 to 45 degrees by appropriately selecting the etching conditions.

A chlorine type etching gas is used as an etching gas for carrying out the present invention. For example, a gas selected from the group consisting of $Cl_2$, $BCl_3$, HCl and $SiCl_4$, or a mixed gas of a plurality of gases selected from the above group, can be used as an etching gas.

Because the chlorine type gas has little difference between etching rate to the metal layer 1002a and the etching rate to the second amorphous semiconductor film 1002b, their side edges are almost made aligned. A chlorine type etching gas has different etching rates for the first amorphous semiconductor film and a second amorphous semiconductor film containing an impurity element with one conductivity type (n-type or p-type). Since the etching rate for the second amorphous semiconductor is higher than that for the first amorphous semiconductor film, the ends of the first amorphous semiconductor film can be formed in a tapered shape.

In one constitution of the present invention shown in FIG. 15, a semiconductor device comprises a gate wiring over an insulating surface, an insulating film over the gate wiring, a first amorphous semiconductor film over the insulating film, a source region and a drain region provided in a second amorphous semiconductor film containing an impurity element of one conductivity type over the first amorphous semiconductor film, a source wiring or electrode over the source region or the drain region, and a pixel electrode overlapping and in contact with a part of the electrode, wherein a side edge of the first amorphous semiconductor film is tapered.

In FIG. 15, the side edge of the second amorphous semiconductor film 1002b (source region or drain region) containing an impurity element of one conductivity type (n-type or p-type) is formed almost perpendicularly to the substrate, that is, in alignment with the side edge of the metal layer 1002a (source electrode and drain electrode). However, side edge of the second amorphous semiconductor film 1002b containing the impurity element of one conductivity type (n-type or p-type) or side edge of the metal layer 1002a may be etched into a taper shape.

In other constitution of the present invention, a semiconductor device comprises a gate wiring over an insulating surface, an insulating film over the gate wiring, a first semiconductor film over the insulating film, a source region and a drain region provided in a second amorphous semiconductor film containing an impurity element of one conductivity type over the first amorphous semiconductor film, a source wiring or electrode over the source region and the drain region, and a pixel electrode overlapping with and being in contact with a part of the electrode, wherein a side edge of the first amorphous semiconductor film and a side edge of the second amorphous semiconductor film are tapered.

It is to be noted that in the case where the side edge of the second amorphous semiconductor film 1002b or the side edge of the metal layer 1002a are tapered, they have a taper angle larger than that of the first amorphous semiconductor film.

Further, a dry etching apparatus used in the present invention may be an etching apparatus of RIE or an etching apparatus of ICP. It is to be noted that because a taper angle can be controlled by controlling electric power, the etching apparatus of ICP is preferable.

An etching experiment was conducted. After an insulating film (silicon oxide film) and a first amorphous semiconductor film (amorphous silicon film) and a second amorphous semiconductor film (phosphorus doped silicon film) and Al—Si film (aluminum film containing 2 wt % silicon) were laminated in order, they were selectively covered with a resist and they were etched using a mixture gas of $Cl_2$ and $BCl_3$ in fact. The cross-sectional view after that was observed and is shown in FIG. 19. In FIG. 19, SEM (Scanning Electron Microscope) photograph is shown and its magnification is fifty thousands times. By conducting the etching with the mixture gas of $Cl_2$ and $BCl_3$, the Al—Si film and the second amorphous semiconductor film and the first amorphous semiconductor film can be etched at the same time, and further, only the side edge of the first amorphous semiconductor film can be tapered.

Further, it is possible to use other metal materials in place of the Al—Si film. In that case, it is necessary to select etching condition, typically etching gas. For example, in the case where Ta film (tantalum film) is used as the metal film 1002a, by etching the first amorphous semiconductor film (amorphous silicon film) and the second amorphous semiconductor film (phosphorus doped silicon) and the Ta film, only the first amorphous semiconductor film can be tapered.

Further, in the case where a multi-layer of Tan and Ta is used as the metal film 1002a, by using a mixture gas of $Cl_2$ (gas flow rate of 40 sccm) and $CF_4$ (gas flow rate of 40 sccm as etching gas, the first amorphous semiconductor film (amorphous silicon film) and the second amorphous semiconductor film (phosphorus doped silicon film) and the multi-layer film of Tan and Ta are etched and only the first amorphous semiconductor film can be tapered.

Further, in the case where W (tungsten) film is used as the metal layer 1002a, by using a mixture gas of $Cl_2$ (gas flow rate of 25 sccm) and $CF_4$ (gas flow rate of 25 sccm) and $O_2$ (gas flow rate of 10 sccm) or a mixture gas of $Cl_2$ (gas flow rate of 12 sccm) and $SF_6$ (gas flow rate of 6 sccm) and $O_2$ (gas flow rate of 12 sccm) as an etching gas, the firs amorphous semiconductor film (amorphous silicon film) and the second amorphous semiconductor film (phosphorus doped silicon film) and the W film are etched, and the first amorphous semiconductor film can be tapered similarly.

Further, in the case where Ti (titanium) film is used as the metal layer 1002a, by using a mixture gas of $Cl_2$ and $BCl_3$ as an etching gas, the first amorphous semiconductor film (amorphous silicon film) and the second amorphous semiconductor film (phosphorus doped silicon film) and Ti film are etched, and only the first amorphous semiconductor film can be tapered.

Further, in FIG. 15, when formed into an island shape by etching using the second photomask, the side edge of the first amorphous semiconductor film is tapered, as illustrated above. However, as shown in FIG. 23, the present invention can be applied to a step (channel etching) of removing a part of the first amorphous semiconductor film 2001 overlapping with the gate electrode 2000 through an insulating film. By using a third photomask and using an etching gas of chlorine type similarly, the metal layer 2002a and the second amorphous semiconductor film 2002b and the first amorphous semiconductor film 2001 are etched and only the first amorphous semiconductor film 2001 can be tapered so that a protective film (passivation film) is formed with favorable coverage at a later step. It is to be noted that reference numeral 2003 designates a pixel electrode and the reference numeral 2004 designates a gate insulating film.

Further, in the eighth step of the constitution of the above manufacturing method, a part of the first amorphous semiconductor film and the conductive film and the second amorphous semiconductor film are etched with a chlorine type gas.

Further, according to the constitution shown in FIG. 23 according to one of the present invention, a semiconductor device comprises a gate wiring over an insulating surface, a gate insulating film over the gate wiring, an amorphous semiconductor film over the gate insulating film, a source region and a drain region over the amorphous semiconductor film, a source wiring or electrode over the source region and the drain region, and a pixel electrode overlapping with and in contact with a part of the electrode wherein a region of the amorphous semiconductor film overlapping with the gate wiring with the gate insulating film therebetween and not overlapping with the source region and the drain region has a thickness thinner than the other region and is tapered to become thin toward the center thereof.

Further, in the above constitution, the region having the taper shape has an angle in the range of 5° to 45°.

Further, in the above constitution, the side edge of the first amorphous semiconductor film may be tapered with an angle in the range of 5° to 45°.

On the other hand, as a comparative example, FIG. 16 shows a TFT including a first amorphous semiconductor film and a second amorphous semiconductor film, each having the ends that are etched to be perpendicular to the substrate. The amorphous semiconductor films 1005 and 1006b are etched separately from the etching of the metal layer 1006a. After the metal layer 1006a is selectively wet etched, a first amorphous semiconductor film 1005 and a second amorphous semiconductor film 1006 containing an impurity element with one conductivity type (n-type or p-type) of the TFT are dry etched with a mixed gas of $CF_4$ and $O_2$ using the metal layer as a mask. The first amorphous semiconductor film 1005 and the second amorphous semiconductor film 1006 containing an impurity element with one conductivity type (n-type or p-type) are simultaneously etched. As a result, the shapes of the ends of the first amorphous semiconductor film 1005 and the second amorphous semiconductor film 1006 containing an impurity element with one conductivity type (n-type or p-type) is formed to be perpendicular to the substrate in the almost same shape as each other as shown in FIG. 16. Then, a pixel electrode 1007 is formed on these films 1005 and 1006. In the respective etchings in the comparative example, a side etching (an undercut) is produced so that when a film is formed later, there is a fear that the film might be cut at a step.

In the above-described structure shown in FIG. 16, poor coverage occurs at the ends of the first amorphous semiconductor film 1005 and the second amorphous semiconductor film 1006 containing an impurity element with one conductivity type (n-type or p-type) and the metal layer 1006a. The poor coverage occurs to such a degree that the pixel electrode 1007 cannot be formed in a normal state due to a poor etching or due to a step shape of the three layers.

During the etching for manufacturing the above shape shown in FIG. 16, an insulating film 1008 in the vicinity of the ends of the first amorphous semiconductor film 1005 is also etched to generate a variation of the insulating film in thickness.

The other structure of the present invention, which is different from the above-described structure, will be described below. In the present invention, the manufacturing steps from the formation of a conductive film to the formation of a pixel electrode are carried out with three photomasks so as to solve the problem of poor coverage of a pixel electrode.

The three photomasks are respectively characterized as follows:
the first photomask is for forming a conductive film;
the second photomask is for forming an insulating film, a first amorphous semiconductor film, and a second amorphous semiconductor film containing an impurity element with one conductivity type (n-type or p-type); and
the third photomask is for forming a pixel electrode, a source region, a drain region, a source electrode and a drain electrode, and for channel etching.

According to other constitution of manufacturing method shown in the present specification, a method for manufacturing a semiconductor device comprises:
a first step of forming a gate wiring over an insulating surface;
a second step of forming an insulating film covering the insulating surface and the gate wiring;
a third step of forming a first amorphous semiconductor film over the insulating film;
a fourth step of forming a second amorphous semiconductor film containing an impurity element of one conductivity type over the first amorphous semiconductor film;
a fifth step of forming a conductive film comprising a metallic material over the second amorphous semiconductor film;
a sixth step of etching the insulating film and the first amorphous semiconductor film and the second amorphous semiconductor film and the conductive film to taper a side edge of the first amorphous semiconductor film;
a seventh step of forming a transparent conductive film over the conductive film; and
an eighth step of etching a part of the first amorphous semiconductor film and the transparent conductive film and the conductive film and the second amorphous semiconductor film to expose a part of the first amorphous semiconductor film and to form a pixel electrode from the transparent conductive film and to form a source wiring from the conductive film and to form a source region and a drain region from the second amorphous semiconductor film.

A TFT manufactured by utilizing the present invention is shown in FIG. 17. According to the present invention, the ends of a first amorphous semiconductor film 1801 are tapered so as to improve the coverage. In order to taper the ends of the first amorphous semiconductor film 1801, an inverse-stagger TFT is manufactured with three photomasks by using a chlorine type etching gas. As a result, the ends of the first amorphous semiconductor film 1801 can be manufactured to have a tapered shape, thereby solving the problem of poor coverage of a pixel electrode 1803.

Herein, a tapered shape angle (taper angle) of the first amorphous semiconductor film 1801 is defined as an angle formed by the surface of a substrate and an inclined portion of the end of the first amorphous semiconductor film 1801 (FIG. 22B). As shown in FIG. 22A, a taper angle of the end of the first amorphous semiconductor film can be controlled to fall within the range of 5 to 45 degrees by appropriately selecting the etching conditions.

A chlorine type etching gas is used as an etching gas for carrying out the present invention. For example, a gas selected from the group consisting of $Cl_2$, $BCl_3$, HCl and SiCl$_4$, or a mixed gas of a plurality of gases selected from the above group, can be used as an etching gas.

Because a chlorine type gas has an etching rate to the metal layer 1802a and an etching rate to the second amorphous semiconductor film with a little difference, their side edges are almost aligned with each other. However, a chlorine type gas has different etching rates for the first amorphous semiconductor film and a second amorphous semiconductor film containing an impurity element with one conductivity type (n-type or p-type). Since the etching rate for the second amorphous semiconductor film containing an impurity element with one conductivity type (n-type or p-type) is higher than that for the first amorphous semiconductor film, the ends of the first amorphous semiconductor film can be formed in a tapered shape.

According to the constitution of one of the present invention shown in FIG. 17, a semiconductor device comprises a gate wiring over an insulating surface, an insulating film over the gate wiring, a first amorphous semiconductor film over the insulating film, a source region and a drain region provided in a second amorphous semiconductor film containing an impurity element of one conductivity type over the first amorphous semiconductor film, a source wiring or electrode over the source region or the drain region, and a pixel electrode overlapping with and in contact with a part of the electrode, wherein only a side edge of the first amorphous semiconductor film is tapered and is aligned with a side edge of the insulating film, and the side edge of the insulating film is not aligned with the source wiring or electrode.

In FIG. 17, the ends of a metal layer 1802a and a second amorphous semiconductor film 1802 containing an impurity element with one conductivity type (n-type or p-type) are formed so as to be perpendicular to the substrate. However, the ends of a metal layer 1802a and a second amorphous semiconductor film 1802 containing an impurity element with one conductivity type (n-type or p-type) may alternatively be formed in a tapered shape.

An experiment of the etching was carried out. An insulating film and a first amorphous semiconductor film and a second amorphous semiconductor film and an Al—Si film (aluminum film containing 2 wt % silicon) are laminated over a substrate in order. Thereafter, they are selectively covered with a photoresist and actually etched using a mixed gas of Cl$_2$ and BCl$_3$. A resultant cross-sectional view was observed and is shown in FIG. 20. FIG. 20 is an SEM (scanning electron microscope) photograph taken at a magnifying power of 50000. By etching with a mixture gas of Cl$_2$ and BCl$_3$, the Al—Si film and the second amorphous semiconductor film and the first amorphous semiconductor film can be etched at the same time so that only a side edge of the first amorphous semiconductor film can be tapered. Further, in FIG. 20, the insulating film is removed using the first amorphous semiconductor film as a mask.

Further, in FIG. 17, when formed into an island shape by etching using the second photomask, the side edge of the first amorphous semiconductor film is tapered. However, in a channel etch type TFT, the present invention can be applied a step (channel etching) of removing a part of the first amorphous semiconductor film overlapping with the gate electrode through the insulating layer. By using a third photomask and an etching gas of chlorine type similarly, the metal layer and the second amorphous semiconductor film and the first amorphous semiconductor film and the insulating film are etched, and only the first amorphous semiconductor film can be tapered so that in the case where a protective film (passivation film) is formed at a later step, a favorable coverage can be obtained.

On the other hand, as a comparative example, FIG. 18 shows a TFT including a first amorphous semiconductor film and a second amorphous semiconductor film, each having the ends that are etched to be perpendicular to the substrate. Etching of the metal layer 1902a and etching of the amorphous semiconductor films 1901 and 1902b are conducted separately from each other. After the metal layer 1902a is selectively etched, a first amorphous semiconductor film 1901 and a second amorphous semiconductor film 1902 containing an impurity element with one conductivity type (n-type or p-type) of the are etched with a mixed gas of CF$_4$ and O$_2$. The first amorphous semiconductor film 1901 and the second amorphous semiconductor film 1902 containing an impurity element with one conductivity type (n-type or p-type) are simultaneously etched. As a result, the ends of the first amorphous semiconductor film 1901 and the second amorphous semiconductor film 1902 containing an impurity element with one conductivity type (n-type or p-type) are formed to be perpendicular to the substrate as shown in FIG. 18. Then, a pixel electrode 1903 is formed on these films.

In the above-described structure, poor coverage occurs at the ends of the first amorphous semiconductor film 1901 and the second amorphous semiconductor film 1902 containing an impurity element with one conductivity type (n-type or p-type) and the metal film 1902a and the insulating film 1904. The poor coverage occurs to such a degree that the pixel electrode 1903 can not be formed in a normal state due to the thickness of the four films.

BRIEF DESCRIPTION OF THE DRAWINGS

In the accompanying drawings:
FIGS. 2A to 2C are diagrams showing the steps of manufacturing a semiconductor device;
FIGS. 3A to 3C are diagrams showing the steps of manufacturing the semiconductor device;
FIGS. 4A and 4B are diagrams showing the steps of manufacturing the semiconductor device;
FIGS. 5A to 5C are diagrams showing the steps of manufacturing the semiconductor device;
FIGS. 6A to 6C are diagrams showing the steps of manufacturing the semiconductor device;
FIGS. 7A to 7C are diagrams showing the steps of manufacturing the semiconductor device;
FIGS. 9A to 9C are diagrams showing the steps of manufacturing the semiconductor device;
FIGS. 10A to 10C are diagrams showing the steps of manufacturing the semiconductor device;
FIGS. 11A to 11C are diagrams showing the steps of manufacturing the semiconductor device;
FIGS. 13A and 13B are diagrams showing the steps of manufacturing the semiconductor device.

DESCRIPTION OF THE PREFERRED EMBODIMENTS

Figure 1:
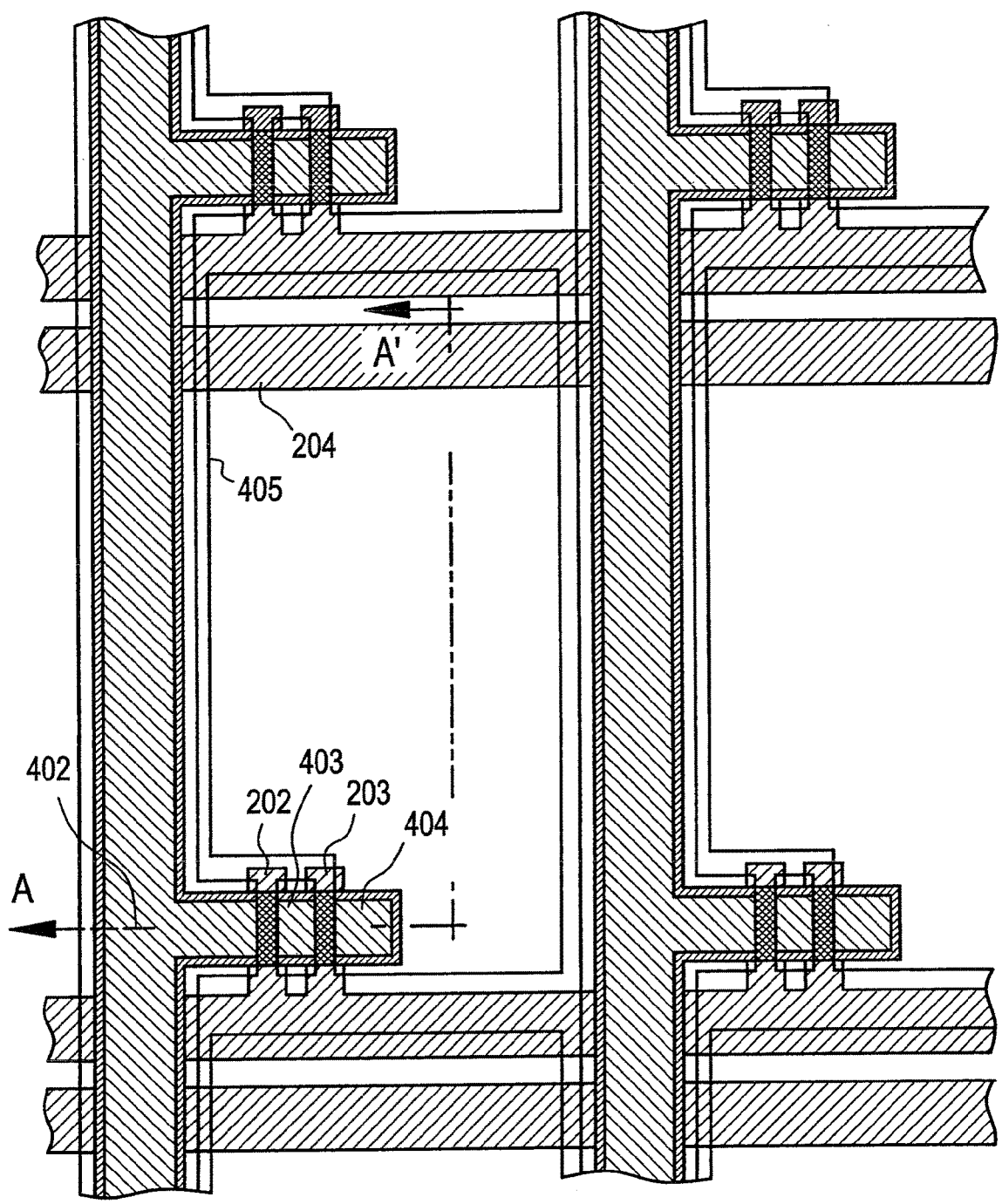
FIG. 1 is a top plan view showing a pixel.
Figure 8:
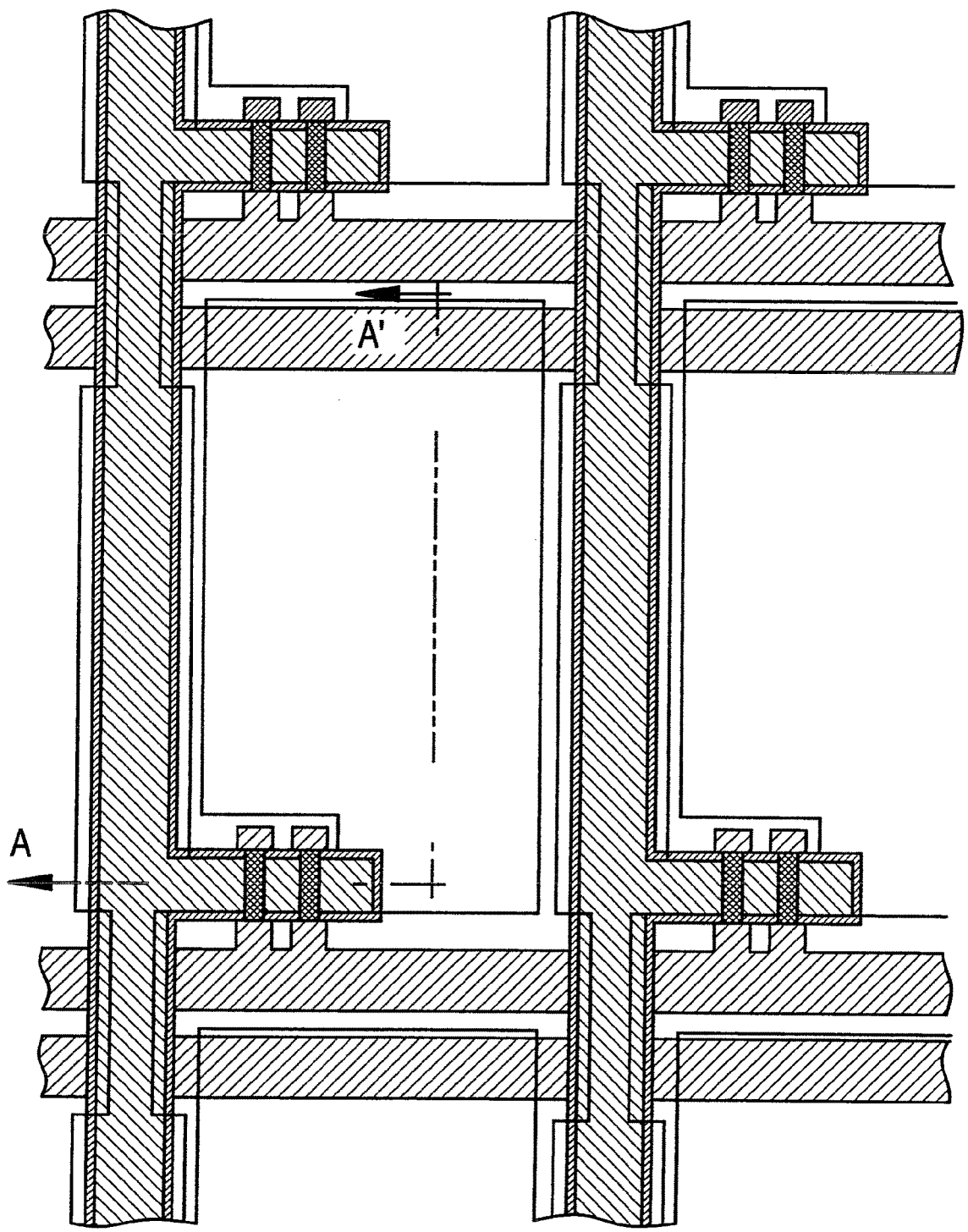
FIG. 8 is a top plan view showing a pixel in Embodiment 3 of the present invention.

Hereinafter, a semiconductor device manufactured by carrying out the present invention will be described.

Embodiment Mode 1

First, a conductive film is formed on the entire surface of a substrate. The conductive film is formed into a desired shape through a first photolithography step. As a material of the conductive film, an element selected from W, $WSi_x$, Al, Ti, Mo, Cu, Ta, Cr, Ni, and Mo, a film containing as a main component an alloy material or compound material containing the element as a main component, or a multi-layer film thereof can be enumerated. Later, the conductive film is etched to become a gate electrode or a gate wiring or a retention capacitance wiring.

Next, an insulating film is formed on the entire surface of the conductive film Later, the insulating film functions as a gate insulating film. A first amorphous semiconductor film and a second amorphous semiconductor film containing an impurity element with one conductivity type (n-type or p-type) and a conductive film comprising a metallic material (a metallic material containing Al, Ti, Mo, Cu, Ta, Cr, Ni or Mo as a main component) are formed on the insulating film. Here, a conductive film containing Al as a main component is formed.

Then, an unnecessary portion of the layered film formed of the first amorphous semiconductor film and the second amorphous semiconductor film containing an impurity element with one conductivity type (n-type or p-type) and the conductive film comprising metallic material is removed by etching through a second photolithography step. Here, without changing the etching gas, the first amorphous semiconductor film and the second amorphous semiconductor film and the conductive film are etched. The etching is conducted using a chlorine type gas for example a mixed gas of $Cl_2$ and $BCl_3$ as an etching gas so that the ends of the conductive film comprising metallic material (Al) and the second amorphous semiconductor film containing an impurity element with one conductivity type (n-type or p-type) are etched perpendicularly to the substrate while the ends of the first amorphous semiconductor film are tapered. Note that the ends of the second amorphous semiconductor film containing an impurity element with one conductivity type (n-type or p-type) may also be tapered.

Here, because a conductive material containing Al as a main component as the conductive film to become a source electrode or a drain electrode later, etching is conducted using a mixture gas of $Cl_2$ and $BCl_3$ as an etching gas. However, not limited to that. When a material containing Ti is used, the side edge of the first amorphous semiconductor film can be tapered using the same mixture gas. Further, when a conductive material containing Ta as a main component is used for the conductive film, the side edge of the first amorphous semiconductor film can be tapered by using $Cl_2$ gas or a mixture gas of Cl, gas and $CF_4$ gas. Further, when a conductive material containing W as a main component is used for the conductive film, the side edge of the first amorphous semiconductor film can be tapered by using a mixture gas of $Cl_2$ gas and $CF_4$ gas and $O_2$ gas or a mixture gas of $Cl_2$ gas and $SF_4$ gas and $O_2$ gas.

Next, after removal of a second resist mask, another resist mask is formed by using a shadow mask so as to selectively remove the insulating film covering a pad portion of a terminal portion.

Next, a conductive film comprising a transparent conductive film is formed over the entire surface. As the transparent conductive film, ITO (indium oxide-tin oxide alloy) and an indium oxide-zinc oxide alloy ($In_2O_3$—ZnO) and zinc oxide (ZnO) are enumerated.

Next, a part of the first amorphous semiconductor film and the transparent conductive film and the conductive film comprising metallic material and the second amorphous semiconductor film containing an impurity element with one conductivity type (n-type or p-type) are removed through a third photolithography step to form a source region and a drain region provided in the second amorphous semiconductor film and to simultaneously form a source wiring from the conductive film comprising metallic material and form a pixel electrode from the transparent conductive film.

Figure 23:
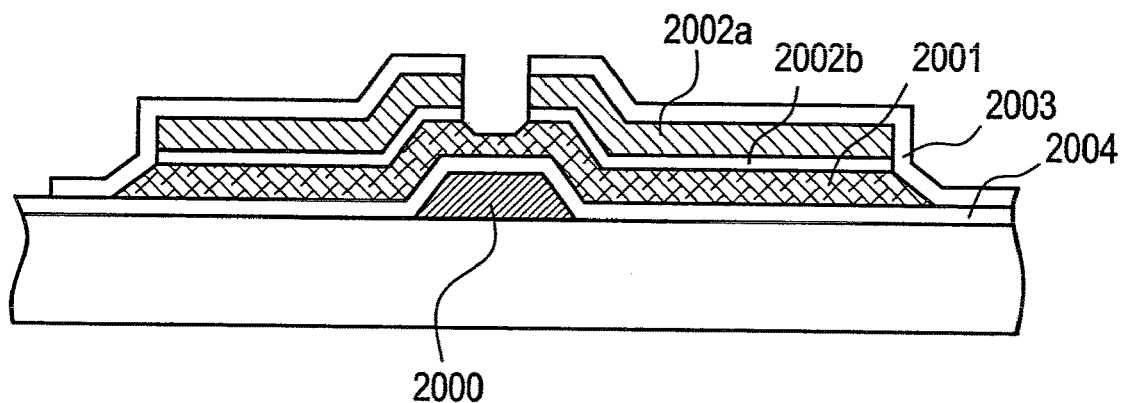
FIG. 23 is a cross-sectional view showing a thin film transistor according to the present invention.

Further, when etching is conducted by using a chlorine gas for example a mixture gas of Cl2 and BCl3 as an etching gas in the third photolithography step, a part to become a channel formation region can be tapered as shown in FIG. 23.

As described above, through three photolithography steps, a semiconductor device including a pixel TFT which has the first amorphous semiconductor film with the tapered ends, the source wiring comprising metallic material, a storage capacitor, and the terminal portion can be manufactured.

Embodiment Mode 2

First, a conductive film is formed on the entire surface of a substrate. The conductive film is formed into a desired shape through a first photolithography step. Later, the conducive film is etched to form a gate electrode or a gate wiring or a storage capacitance wiring.

Next, an insulating film is formed on the entire surface of the conductive film Later, the insulating film functions as a gate insulating film. A first amorphous semiconductor film and a second amorphous semiconductor film containing an impurity element with one conductivity type (n-type or p-type) and a conductive film comprising metallic material (metallic material containing Al, Ti, Mo, Cu, Ta, Cr, Ni or Mo as a main component) are deposited on the insulating film.

Then, an unnecessary portion of the layered film formed of the first amorphous semiconductor film and the second amorphous semiconductor film containing an impurity element with one conductivity type (n-type or p-type) and the conductive film comprising metallic material is removed by etching through a second photolithography step. Here, the first amorphous semiconductor film and the second amorphous semiconductor film and the conductive film are etched without changing the etching gas. The etching is conducted using a chlorine type gas for example a mixed gas of $Cl_2$ and $BCl_3$ as an etching gas so that the ends of the conductive film comprising metallic material and the second amorphous semiconductor film containing an impurity element with one conductivity type (n-type or p-type) are formed to be perpendicular to the substrate while the ends of the first amorphous semiconductor film are tapered. Note that the ends of the second amorphous semiconductor film containing an impurity element with one conductivity type (n-type or p-type) may also be tapered.

Next, an unnecessary portion of the insulating film is removed by etching with continuous use of a second photomask which is used for etching the first amorphous semiconductor film and the second amorphous semiconductor film containing an impurity element with one conductivity type (n-type or p-type).

Next, a conductive film of a transparent conductive film is formed on the entire surface. As the transparent conductive film, ITO (indium oxide-tin oxide alloy) and indium oxide-zinc oxide alloy (In2O3-ZnO) and zinc oxide (ZnO) are enumerated.

Thereafter, a part of the first amorphous semiconductor film and the transparent conductive film and the conductive film comprising metallic material and the second amorphous semiconductor film containing an impurity element with one conductivity type (n-type or p-type) is removed through a third photolithography step to form a source region and a drain region of a gate electrode while forming a source wiring from the conductive film comprising metallic material and forming a pixel electrode from the transparent conductive film.

As described above, through three photolithography steps, a semiconductor display device including a pixel TFT which has the first amorphous semiconductor film with the tapered ends, the source wiring, a storage capacitor, and a terminal portion can be manufactured.

The present invention with the above-described structures will be described further in detail in the following Embodiments.

Embodiments

Embodiment 1

Embodiment 1 of the present invention will be described with reference to FIGS. 1 to 4B. In Embodiment 1, a manufacturing method of a liquid crystal display device is described. A method of manufacturing an inverse-stagger TFT in a pixel portion on a substrate and manufacturing a storage capacitor to be connected to the TFT will be described in detail in the order of the manufacturing steps. In FIGS. 2A to 4B, a terminal portion, which is provided at the end of the substrate so as to be electrically connected to a wiring of a circuit provided on another substrate, is also illustrated in the steps of manufacturing a TFT. The cross-sectional views of FIGS. 2A to 4B correspond to the cross section taken along a line A-A' in FIG. 1.

First, a display device is manufactured by using a substrate 200 with light transmittance. As the substrate 200, a glass substrate such as barium borosilicate glass and alumino borosilicate glass, as represented by #7059 glass and #1737 glass manufactured by Corning Inc., can be used. Besides, a light transmitting substrate such as a quartz substrate and a plastic substrate can also be used as the substrate 200.

After forming a conductive film on the entire surface of the substrate 200, a first photolithography step is conducted to form a resist mask. An unnecessary portion is removed by etching to form gate electrodes 202 and 203, a storage capacitor wiring 204, and a terminal portion 201 (FIG. 2A).

As a material for the electrodes 202 and 203, an element selected from the group consisting of titanium (Ti), tantalum (Ta), tungsten (W), molybdenum (Mo), chromium (Cr) and neodymium (Nd), an alloy containing the above element as a constituent, or a nitride containing the above element as a constituent, is used. Alternatively, the combination of plural selected from: an element selected from the group consisting of titanium (Ti), tantalum (Ta), tungsten (W), molybdenum (Mo), chromium (Cr) and neodymium (Nd); an alloy containing the above element as a constituent; and a nitride containing the above element as a constituent, can be deposited as a laminate layer to form the electrodes 202 and 203.

For application to a large screen, it is desirable to form gate wirings 202 and 203 including the gate electrodes, the capacitor wiring 204 and a terminal of the terminal portion 201, using a low-resistance conductive material. Therefore, aluminum (Al), copper (Cu), silver (Ag), gold (Au), platinum (Pt) or the like, or an alloy containing the above element as a constituent can be used as a material. Since aluminum (Al), copper (Cu) and silver (Ag) are disadvantageous in their low thermal resistance, high corrosiveness and the like, however, these elements can be used in combination with a thermally resistant conductive material.

Next, an insulating film 207 is formed on the entire surface. A silicon nitride film is used as the insulating film 207, and is formed to have a thickness of 50 to 200 nm, preferably, 150 nm. Note that the gate insulating film 207 is not limited to the silicon nitride film; an insulating film such as a silicon oxide film, a silicon nitride oxide film or a tantalum oxide film can also be used (FIG. 2B).

Next, a first amorphous semiconductor film 206 with a thickness of 50 to 200 nm, preferably, 100 to 150 nm, is formed on the entire surface of the insulating film 207 through a known method such as a plasma CVD method or a sputtering method. Typically, an amorphous silicon (a-Si) film is formed to have a thickness of 100 nm. As the first amorphous semiconductor film 206, a microcrystalline semiconductor film and a compound semiconductor film with an amorphous structure, such as an amorphous silicon germanium film, or an amorphous silicon carbide film can also be used (FIG. 2B).

Next, a second amorphous semiconductor film 205 containing an impurity element with one conductivity type (n-type or p-type) is formed to have a thickness of 50 to 200 nm. The second semiconductor film 205 containing an impurity element with one conductivity type (n-type or p-type) is formed on the entire surface by a known method such as a plasma CVD method or a sputtering method. In Embodiment 1, the second amorphous semiconductor film 205 containing an n-type impurity element is formed by using a silicon target to which phosphorus (P) is added. Alternatively, the second amorphous semiconductor film 205 may be formed with a silicon target by sputtering in an atmosphere containing phosphorus. Further alternatively, the second amorphous semiconductor film 205 containing an impurity element that imparts an n-type conductivity may be formed of a microcrystalline silicon hydride film (FIG. 2B). Further, a conductive film 205b comprising metallic material is formed to a thickness of 50 to 200 nm by using sputtering or the like.

Then, a second photolithography step is conducted to form a resist mask 208. A first amorphous semiconductor film 209 and a second amorphous semiconductor film 210 containing an impurity element with one conductivity type (n-type or p-type) and a conductive film 210b are formed to have a desired shape by selectively removing the conductive film and the first amorphous semiconductor film and the second amorphous semiconductor film by etching. In Embodiment 1, the first amorphous semiconductor film 209 and the second amorphous semiconductor film 210 containing an impurity element with one conductivity type (n-type or p-type) and the conductive film 210b are formed by dry etching using a mixed gas of $Cl_2$=40 sccm and $BCl_3$=40 sccm as an etching gas. As a result of etching, the ends of the conductive film 210b the second amorphous semiconductor film 210a containing an impurity element with one conductivity type (n-type or p-type) are perpendicular to the substrate, whereas the ends of the first amorphous semiconductor film 209 are tapered at an angle in the range of 5 to 45 degrees (FIG. 2C).

The ends of the second amorphous semiconductor film 210 containing an impurity element with one conductivity type (n-type or p-type) may be tapered. Although the mixed gas of $Cl_2$=40 sccm and $BCl_3$=40 sccm is used as an etching gas in Embodiment 1, a composition of the etching gas is not limited to the above-mentioned composition as long as a TFT with a shape shown in FIG. 2C is obtained; for example, a gas selected from the group consisting of $Cl_2$, $BCl_3$, HCl and $SiCl_4$, or a mixed gas of a plurality of gases selected from the above group, can be used as an etching gas.

Next, after removal of the resist mask 208, another resist mask is formed by using a shadow mask. After the insulating film 207, which covers a pad portion of the terminal portion, is selectively removed to form an insulating film 301, the resist mask is removed (FIG. 3A). Instead of using the shadow mask, a resist mask formed by screen printing may alternatively be used as an etching mask.

Then, a conductive film 302 of a transparent conductive film is formed on the entire surface (FIG. 3B). The conductive film 302 is formed by sputtering or vacuum evaporation, using indium oxide ($In_2O_3$) or an alloy of indium oxide and tin oxide ($In_2O_3$—$SnO_2$; abbreviated as ITO) as a material.

Next, a third photolithography step is conducted to form a resist mask 403. An unnecessary portion is removed by etching to form a pixel electrode 405 from the transparent conductive film and to form a source wiring 402 and a drain electrode 404 and to expose a part of the first amorphous semiconductor film (FIG. 4A). The etching treatment of the conductive film comprising the transparent conductive film is conducted in a chlorine type solution. After the pixel electrode 405 is formed, etching gases are appropriately changed to etch the metal layer and the second amorphous semiconductor film. It is to be noted that in the above third photolithography step, an overetching is conducted to completely separate the source region and the drain region from each other, and further a part of the first amorphous semiconductor film is removed. In the removed region of the first amorphous semiconductor film, a channel is formed.

Further, similarly to the second photolithography step, a part of the first amorphous semiconductor film and the metal layer and the second amorphous semiconductor film may be etched at a time by using a chlorine type gas in the third photolithography step. In that case, the etched region of the first amorphous semiconductor film overlaps with the gate wiring with a gate insulating film therebetween and does not overlap with the source region or the drain region. The region overlapping with the gate wiring with a gate insulating film therebetween in the first amorphous semiconductor film is referred to as a channel formation region (back channel part). Further, the etched region in the first amorphous semiconductor film has a taper shape in which thickness thereof becomes thinner toward a center of the region. Accordingly, it is possible to manufacture a channel etch type TFT having a channel formation region free from a step.

Subsequently, a resist mask 401 is removed. FIG. 4B shows a cross-sectional view in this state.

As described above, through three photolithography steps, an active matrix substrate comprising a source wiring 402 and a pixel TFT of an inverse stagger type and the storage capacitor 408 and the terminal portion 409 can be obtained. With respect to the following steps, using the know technique, formation of orientation film and rubbing treatment and sticking of a counter substrate and injection of liquid crystal and sealing and sticking of FPC are conducted to complete a liquid crystal display device of transmission type.

Further, if necessary, a protective film comprising a silicon nitride film or a silicon oxynitride film may be formed. It is not provided over a terminal electrode connected with FPC.

The TFT including an active layer formed of the amorphous semiconductor film, obtained in Embodiment 1, has a small field-effect mobility, i.e., only about 1 $cm^2/Vsec$. Therefore, a driving circuit for performing the image display is formed with an IC chip, and is mounted through TAB (tape automated bonding) or COG (chip on glass).

Further, a TFT having a multi-gate structure comprising a plurality of channel formation regions, here a TFT having a double-gate structure, is shown in Embodiment 1. However, a single gate structure may be used without limitation.

Embodiment 2

The semiconductor display device including the channel etch type TFT in the pixel portion has been described in Embodiment 1, while a semiconductor display device including a channel stop type TFT in the pixel portion will be described in Embodiment 2 with reference to FIGS. 5A to 7C.

First, a semiconductor display device is manufactured by using a substrate 500 with light transmittance. As the substrate 500, a glass substrate such as barium borosilicate glass and alumino borosilicate glass, as represented by #7059 glass and #1737 glass manufactured by Corning Inc., can be used. Besides, a light transmitting substrate such as a quartz substrate and a plastic substrate can also be used as the substrate 500.

After forming a conductive film on the entire surface of the substrate 500, a first photolithography step is conducted to form a resist mask. An unnecessary portion is removed by etching to form gate electrodes 502 and 503, a storage capacitor wiring 504, and a terminal portion 501 (FIG. 5A).

As a material for the electrodes 502 and 503, an element selected from the group consisting of titanium (Ti), tantalum (Ta), tungsten (W), molybdenum (Mo), chromium (Cr) and neodymium (Nd), an alloy containing the above element as a constituent, or a nitride containing the above element as a constituent, is used. Alternatively, the combination of plural selected from: an element selected from the group consisting of titanium (Ti), tantalum (Ta), tungsten (W), molybdenum (Mo), chromium (Cr) and neodymium (Nd); an alloy containing the above element as a constituent; and a nitride containing the above element as a constituent, can be deposited as a laminate layer to form the electrodes 502 and 503.

For application to a large screen, it is desirable to form the gate wirings 502 and 503 including the gate electrodes, the capacitor wiring 504 and the terminal 501 of the terminal portion, using a low-resistance conductive material. Therefore, aluminum (Al), copper (Cu), silver (Ag), gold (Au), platinum (Pt) or the like, or an alloy containing the above element as a constituent, can be used as a material. However, since aluminum (Al), copper (Cu) and silver (Ag) are disadvantageous in their low thermal resistance, high corrosiveness and the like, these elements can be used in combination with a thermally resistant conductive material.

Next, an insulating film 506 is formed on the entire surface. A silicon nitride film is used as the insulating film 506, and is formed to have a thickness of 50 to 200 nm, preferably, 150 nm. Note that the gate insulating film 506 is not limited to the silicon nitride film; an insulating film such as a silicon oxide film, a silicon nitride oxide film or a tantalum oxide film can also be used (FIG. 5B).

Next, an amorphous semiconductor film 505 with a thickness of 50 to 200 nm, preferably, 100 to 150 nm, is formed on the entire surface of the insulating film 506 through a known method such as a plasma CVD method or a sputtering method. Typically, an amorphous silicon (a-Si) film is formed to have a thickness of 100 nm (FIG. 5B).

Then, a second photolithography step is conducted to form a resist mask 507. An unnecessary portion is removed by etching to form an amorphous semiconductor film 508. In Embodiment 2, the amorphous semiconductor film 508 is formed by dry etching using a mixed gas of $Cl_2$=40 sccm and $BCl_3$=40 sccm as an etching gas. As a result of etching, the ends of the amorphous semiconductor film 508 are tapered at an angle in the range of 5 to 45 degrees. Although the mixed gas of $Cl_2$=40 sccm and $BCl_3$=40 sccm is used as an etching gas in Embodiment 2, a composition of the etching gas is not limited to the above-mentioned composition as long as a TFT with a shape shown in FIG. 5C is obtained; for example, a gas selected from the group consisting of $Cl_2$, $BCl_3$, HCl and $SiCl_4$, or a mixed gas of a plurality of gases selected from the above group can be used as an etching gas.

Next, after removal of the resist mask 507, another resist mask is formed by using a shadow mask. After the insulating film 506, which covers a pad portion of the terminal portion, is selectively removed to form an insulating film 601, the resist mask is removed (FIG. 6A). Instead of using the shadow mask, a resist mask formed by screen printing may alternatively be used as an etching mask.

Next, a doping step is conducted to form an LDD (lightly doped drain) region of the n-channel TFT. The doping is performed by ion doping or ion implantation. Phosphorus is added as an n-type impurity so as to form impurity regions 604 to 606 with the use of second insulating films 602 and 603 as masks. A donor density of these regions is set to $1\times10^{16}$ to $1\times10^{17}/cm^3$.

Then, a conductive film 608 of a transparent conductive film is formed on the entire surface (FIG. 6C). The conductive film 608 is formed by sputtering or vacuum evaporation, using indium oxide ($In_2O_3$) or an alloy of indium oxide and tin oxide ($In_2O_3$—$SnO_2$; abbreviated as ITO) as a material. An etching treatment for such a material is conducted with a chlorine type solution.

Next, a third photolithography step is conducted to form a resist mask 701. An unnecessary portion is removed by etching to form a source wiring 706, a source region 702, a drain region 704 and a pixel electrode 705 (FIG. 7B).

Subsequently, the resist mask 701 is removed. FIG. 7C shows a cross-sectional view in this state.

As described above, through three photolithography steps, a light transmitting semiconductor display device including the source wiring 706, an inverse-stagger pixel TFT 707, a storage capacitor 708 and a terminal portion 709 can be manufactured.

As in Embodiment 1, a driving circuit formed with an IC chip is mounted to perform the image display in Embodiment 2.

Embodiment 3

Embodiment 3 of the present invention will be described with reference to FIGS. 8 to 10C. In Embodiment 3, a manufacturing method of a liquid crystal display device is described. A method of manufacturing an inverse-stagger TFT in a pixel portion on a substrate and manufacturing a storage capacitor connected to the TFT will be described in detail in the order of the manufacturing steps. In FIGS. 9A to 10C, a terminal portion, which is provided at the end of the substrate so as to be electrically connected to a wiring of a circuit provided on another substrate, is also illustrated in the steps of manufacturing a TFT. The cross-sectional views of FIGS. 9A to 10C correspond to the cross section cut along a line A-A' in FIG. 8.

First, a semiconductor display device is manufactured by using a substrate 1200 with light transmittance. As the substrate 1200, a glass substrate such as barium borosilicate glass and alumino borosilicate glass, as represented by #7059 glass and #1737 glass manufactured by Corning Inc., can be used. Besides, a light transmitting substrate such as a quartz substrate and a plastic substrate can also be used as the substrate 1200.

After forming a conductive film on the entire surface of the substrate 1200, a first photolithography step is conducted to form a resist mask. An unnecessary portion is removed by etching so as to form gate electrodes 1202 and 1203, a storage capacitor wiring 1204, and a terminal portion 1201 (FIG. 9A).

As a material for the electrodes 1202 and 1203, an element selected from the group consisting of titanium (Ti), tantalum (Ta), tungsten (W), molybdenum (Mo), chromium (Cr) and neodymium (Nd), an alloy containing the above element as a constituent, or a nitride containing the above element as a constituent, is used. Alternatively, the combination of plural selected from: an element selected from the group consisting of titanium (Ti), tantalum (Ta), tungsten (W), molybdenum (Mo), chromium (Cr) and neodymium (Nd); an alloy containing the above element as a constituent; and a nitride containing the above element, can be deposited as a laminate layer to form the electrodes 1202 and 1203.

For application to a large screen, it is desirable to form gate wirings including the gate electrodes 1202 and 1203, the capacitor wiring 1204 and a terminal of the terminal portion 1201, using a low-resistance conductive material. Therefore, aluminum (Al), copper (Cu), silver (Ag), gold (Au), platinum (Pt) or the like or an alloy containing the above element as a constituent can be used as a material. However, since aluminum (Al), copper (Cu) and silver (Ag) are disadvantageous in their low thermal resistance, high corrosiveness and the like, these elements can be used in combination with a thermally resistant conductive material.

Next, an insulating film 1207 is formed on the entire surface. A silicon nitride film is used as the insulating film 1207, and is formed to have a thickness of 50 to 200 nm, preferably, 150 nm. The gate insulating film 1207 is not limited to the silicon nitride film; an insulating film such as a silicon oxide film, a silicon nitride oxide film or a tantalum oxide film can also be used (FIG. 9B).

Next, a first amorphous semiconductor film 1206 with a thickness of 50 to 200 nm, preferably, 100 to 150 nm, is formed on the entire surface of the insulating film 1207 through a known method such as a plasma CVD method or a sputtering method. Typically, an amorphous silicon (a-Si) film is formed to have a thickness of 100 nm. As the first amorphous semiconductor film 1206, a microcrystalline semiconductor film and a compound semiconductor film with an amorphous structure, such as an amorphous silicon germanium film, or an amorphous silicon carbide film can also be used (FIG. 9B).

Next, a second amorphous semiconductor film 1205 containing an impurity element with one conductivity type (n-type or p-type) is formed to have a thickness of 50 to 200 nm. The second semiconductor film 1205 containing an impurity element with one conductivity type (n-type or p-type) is formed on the entire surface by a known method such as a plasma CVD method or a sputtering method. In Embodiment 3, the second amorphous semiconductor film 1205 containing an n-type impurity element is formed by using a silicon target to which phosphorus (P) is added. Alternatively, the second amorphous semiconductor film 1205 may be formed with a silicon target by sputtering in an atmosphere containing phosphorus. Further alternatively, the second amorphous semiconductor film 1205 containing an impurity element that imparts an n-type conductivity may be formed of a microcrystalline silicon hydride film (FIG. 9B). Further, a conductive film 1205b comprising metallic material is formed to a thickness of 50 to 200 nm by sputtering or the like. (FIG. 9(B))

Then, a second photolithography step is conducted to form a resist mask 1208. A conductive film and a first amorphous semiconductor film 1209 and a second amorphous semiconductor film 1210 containing an impurity element with one conductivity type (n-type or p-type) are formed to have a desired shape by etching. In Embodiment 3, the first amorphous semiconductor film 1209 and the second amorphous semiconductor film 1210 containing an impurity element with one conductivity type (n-type or p-type) and the conductive film 1210b are formed by dry etching using a mixed gas of $Cl_2$=40 sccm and $BCl_3$=40 sccm as an etching gas. As a result of etching, the ends of the conductive film 1210b and the second amorphous semiconductor film 1210 containing an impurity element with one conductivity type (n-type or p-type) are formed perpendicular to the substrate, whereas the ends of the first amorphous semiconductor film 1209 are tapered at an angle in the range of 5 to 45 degrees (FIG. 9C).

The ends of the second amorphous semiconductor film 1210 containing an impurity element with one conductivity type (n-type or p-type) may also be tapered. Although the mixed gas of $Cl_2$=40 sccm and $BCl_3$=40 sccm is used as an etching gas in Embodiment 3, a composition of an etching gas is not limited to the above-mentioned composition as long as a TFT with a shape shown in FIG. 9C is obtained; for example, a gas selected from the group consisting of $Cl_2$, $BCl_3$, HCl and $SiCl_4$ or a mixed gas of a plurality of gases selected from the above group can be used as an etching gas.

Next, with continuous use of the resist mask 1208, an insulating film 1211 is formed in a desired shape by etching. In Embodiment 3, the insulating film 1211 is formed by dry etching using a gas of $CHF_3$=35 sccm as an etching gas (FIG. 9C). Although a gas of $CHF_3$=35 sccm is used as an etching gas in Embodiment 3, a composition of the etching gas is not limited thereto as long as a TFT with a shape shown in FIG. 9C is manufactured.

Then, a conductive film 1301 of a transparent conductive film is formed on the entire surface (FIG. 10A). The conductive film 1301 is formed by sputtering, vacuum evaporation, or the like using indium oxide ($In_2O_3$) or an alloy of indium oxide, tin oxide ($In_2O_3$—$SnO_2$; abbreviated as ITO) etc., as a material.

Next, a third photolithography step is conducted to form a resist mask 1302. An unnecessary portion is removed by etching to form a source wiring 1303, a source region, a drain region, a drain electrode 1305 and a pixel electrode 1306 (FIG. 10B). It is to be noted that after the conductive film comprising a transparent conductive film is subjected to en etching treatment using a chlorine type solution, the metal film and the second amorphous semiconductor film are etched by using a gas. Further, in the above third photolithography step, in order to completely separate the source region and the drain region from each other, an overetching is conducted, and a part of the first amorphous semiconductor film is removed.

Subsequently, the resist mask 1302 is removed. FIG. 10C shows a cross-sectional view in this state.

As described above, through three photolithography steps, an active matrix substrate including the source wiring 1303, an inverse-stagger pixel TFT 1308, a storage capacitor 1309 and a terminal portion 1310 can be manufactured. With respect to the following steps, by using known technique, formation of orientation film and rubbing treatment and sticking of counter substrate and injection of liquid crystal and sealing and sticking of FPC are conducted to complete a transmission type liquid crystal display device.

Further, if necessary, a protective film comprising silicon nitride film and silicon oxynitride film may be formed. It is not provided over a terminal electrode connected with FPC or the like.

The TFT including an active layer formed of the amorphous semiconductor film, obtained in Embodiment 3, has a small field-effect mobility, i.e., only about 1 $cm^2$/Vsec. Therefore, a driving circuit for performing the image display is formed with an IC chip, and is mounted through TAB (tape automated bonding) or COG (chip on glass).

Further, a TFT having a multi-gate structure comprising a plurality of channel formation regions, here a TFT having a double gate structure, is illustrated in Embodiment 3. However, a single gate structure may be used without limitation.

Embodiment 4

The semiconductor display device including the channel etch type TFT in the pixel portion has been described in Embodiment 3, while a semiconductor display device including a channel stop type TFT in the pixel portion will be described in Embodiment 4 with reference to FIGS. 11A to 13B.

First, a semiconductor display device is manufactured by using a substrate 1400 with light transmittance. As the substrate 1400, a glass substrate such as barium borosilicate glass and alumino borosilicate glass, as represented by #7059 glass and #1737 glass manufactured by Corning Inc., can be used. Besides, a light transmitting substrate such as a quartz substrate and a plastic substrate can also be used as the substrate 1400.

After forming a conductive film on the entire surface of the substrate 1400, a first photolithography step is conducted to form a resist mask. An unnecessary portion is removed by etching to form gate electrodes 1402 and 1403, a storage capacitor wiring 1404, and a terminal portion 1401 (FIG. 11A).

As a material for the electrodes 1402 and 1403, an element selected from the group consisting of titanium (Ti), tantalum (Ta), tungsten (W), molybdenum (Mo), chromium (Cr) and neodymium (Nd), an alloy containing the above element as a constituent, or a nitride containing the above element as a constituent, is used. Alternatively, the combination of plural selected from: an element selected from the group consisting of titanium (Ti), tantalum (Ta), tungsten (W), molybdenum (Mo), chromium (Cr) and neodymium (Nd); an alloy containing the above element as a constituent; and a nitride containing the above element as a constituent, can be deposited as a laminate layer to form the electrodes 1402 and 1403.

For application to a large screen, it is desirable to form gate wirings including the gate electrodes 1402 and 1403, the storage capacitor 1404 and a terminal of the terminal portion 1401, using a low-resistance conductive material. Therefore, aluminum (Al), copper (Cu), silver (Ag), gold (Au), platinum (Pt) or the like, or an alloy containing the above element as a constituent, can be used as a material. However, since aluminum (Al), copper (Cu) and silver (Ag) are disadvantageous in their low thermal resistance, high corrosiveness and the like, these elements can be used in combination with a thermally resistant conductive material.

Next, an insulating film 1406 is formed on the entire surface. A silicon nitride film is used as the insulating film 1406, and is formed to have a thickness of 50 to 200 nm, preferably, 150 nm. The gate insulating film 1406 is not limited to the silicon nitride film; an insulating film such as a silicon oxide film, a silicon nitride oxide film or a tantalum oxide film can also be used (FIG. 11B).

Next, an amorphous semiconductor film 1405 with a thickness of 50 to 200 nm, preferably, 100 to 150 nm, is formed on the entire surface of the insulating film 1406 through a known method such as a plasma CVD method or a sputtering method. Typically, an amorphous silicon (a-Si) film is formed to have a thickness of 100 nm (FIG. 11B).

Then, a second photolithography step is conducted to form a resist mask 1407. An unnecessary portion is removed by etching to form an amorphous semiconductor film 1408. In Embodiment 4, the amorphous semiconductor film 1408 is formed by dry etching using a mixed gas of $Cl_2$=40 sccm and $BCl_3$=40 sccm as an etching gas. As a result of etching, the ends of the amorphous semiconductor film 1408 are tapered at an angle in the range of 5 to 45 degrees. Although the mixed gas of $Cl_2$=40 sccm and $BCl_3$=40 sccm is used as an etching gas in Embodiment 4, a composition of an etching gas is not limited to the above-mentioned composition as long as a TFT with a shape shown in FIG. 11C is obtained; for example, a gas selected from the group consisting of $Cl_2$, $BCl_3$, HCl and $SiCl_4$ or a mixed gas of a plurality of gases selected from the above group can be used as an etching gas.

Next, with continuous use of the resist mask 1407, an insulating film 1409 is formed in a desired shape by etching. In Embodiment 4, the insulating film 1409 is formed by dry etching using a gas of $CHF_3$=35 sccm as an etching gas (FIG. 11C). Although a gas of $CHF_3$=35 sccm is used as an etching gas in Embodiment 4, a composition of the etching gas is not limited thereto as long as a TFT with a shape shown in FIG. 11C is manufactured.

Figure 12A:
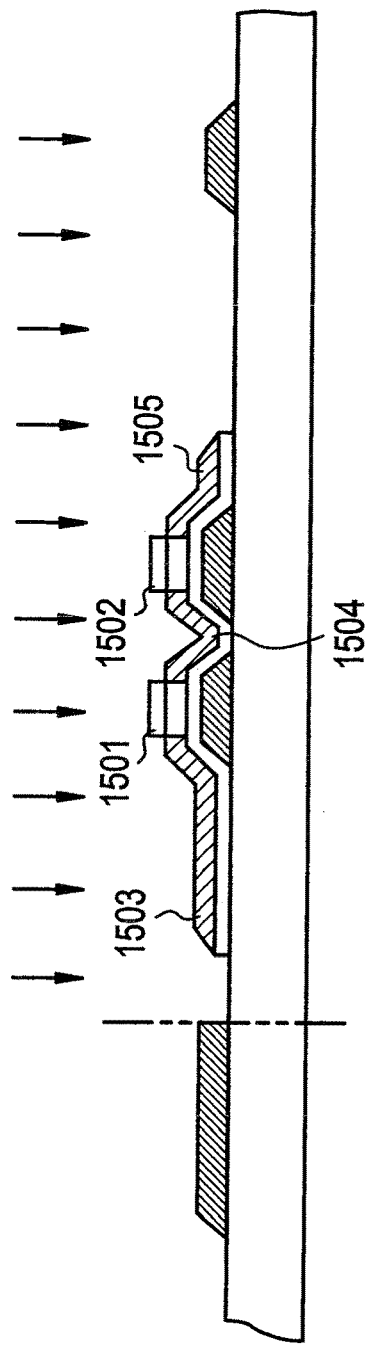
FIGS. 12A and 12B are diagrams showing the steps of manufacturing the semiconductor device.

Next, a doping step is conducted to form an LDD (lightly doped drain) region of the n-channel TFT. The doping is performed by ion doping or ion implantation. Phosphorus is added as an n-type impurity so as to form impurity regions 1503 to 1505 with the use of second insulating films 1501 and 1502 as masks. A donor density of these regions is set to $1\times10^{16}$ to $1\times10^{17}/cm^3$ (FIG. 12A).

Figure 12B:
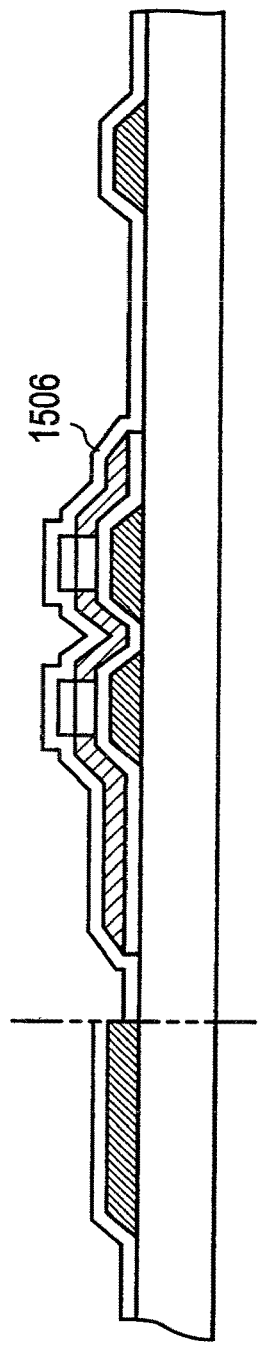

Then, a conductive film 1506 of a transparent conductive film is formed on the entire surface (FIG. 12B). The conductive film 1506 is formed by sputtering or vacuum evaporation, using indium oxide ($In_2O_3$) or an alloy of indium oxide and tin oxide ($In_2O_3$—$SnO_2$; abbreviated as ITO) as a material. An etching treatment for such a material is conducted with a chlorine type solution.

Next, a third photolithography step is conducted to form a resist mask 1601. An unnecessary portion is removed by etching to form a source wiring 1605, a source region 1602, a drain region 1604 and a pixel electrode 1605 (FIG. 13A).

Subsequently, the resist mask 1601 is removed. FIG. 13B shows a cross-sectional view in this state.

As described above, through three photolithography steps, a light transmitting semiconductor display device including the source wiring 1606, an inverse-stagger pixel TFT 1607, a storage capacitor 1608 and a terminal portion 1609 can be manufactured.

As in Embodiment 3, a driving circuit formed with an IC chip is mounted to perform the image display in Embodiment 4.

Embodiment 5

The active-matrix substrate and the liquid crystal display device, manufactured through embodiments of the present invention, can be used for various electro-optical apparatuses. Specifically, the present invention can be applicable for all electronic devices including such an electro-optical apparatus as a display section.

As examples of such electronic devices, video cameras, car navigation systems, personal computers and portable information terminals (such as mobile computers, portable telephones, or electronic books) can be given. Some examples of these electronic devices are shown in FIGS. 14A to 14D.

Figure 14A:
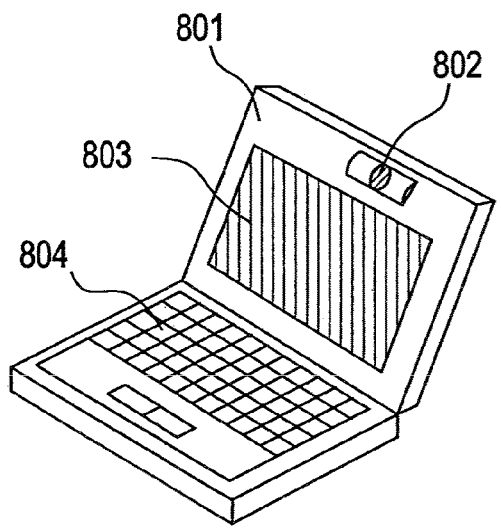
FIGS. 14A to 14D are diagrams illustrating examples of apparatuses utilizing the semiconductor device.

FIG. 14A illustrates a personal computer including a main body 801, an image input section 802, a display section 803 and a keyboard 804.

Figure 14B:
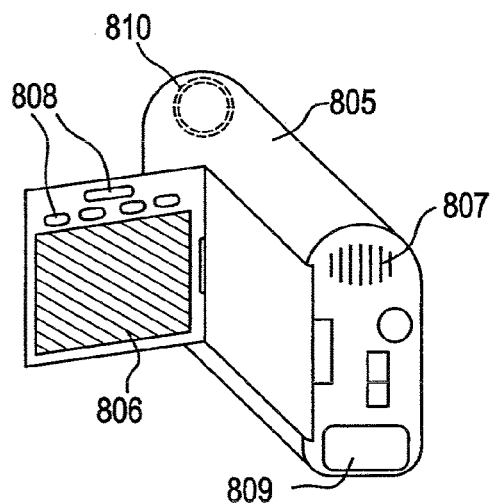

FIG. 14B illustrates a video camera including a main body 805, a display section 806, a voice input section 807, operation switches 808, a battery 809 and an image-receiving section 810.

Figure 14C:
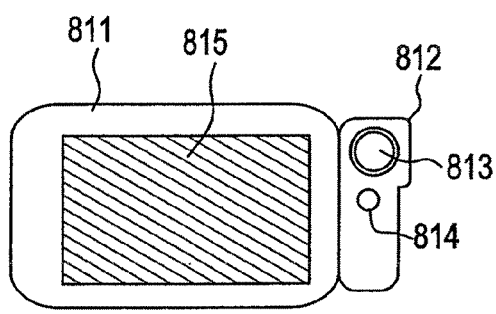

FIG. 14C is a digital camera including a main body 811, a camera section 812, an image-receiving section 813, operation switches 814, and a display section 815.

Figure 14D:
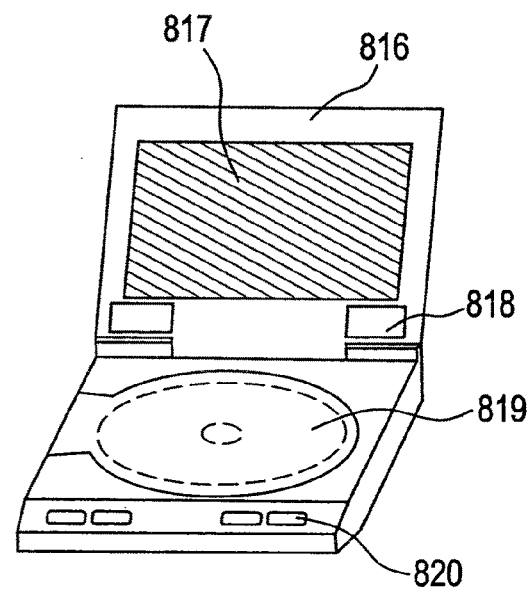
Figure 15:
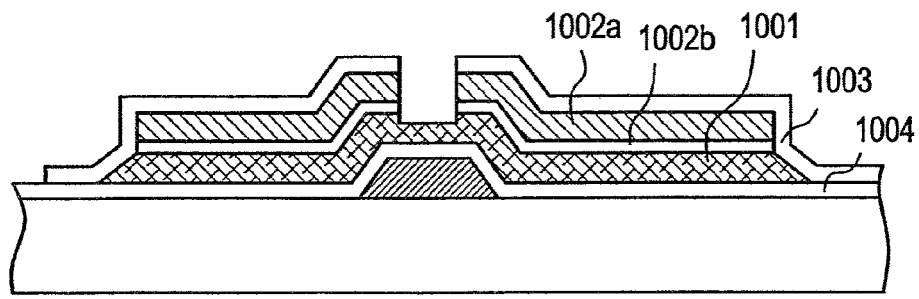
FIG. 15 is a cross-sectional view showing a thin-film transistor manufactured by using the present invention.
Figure 16:
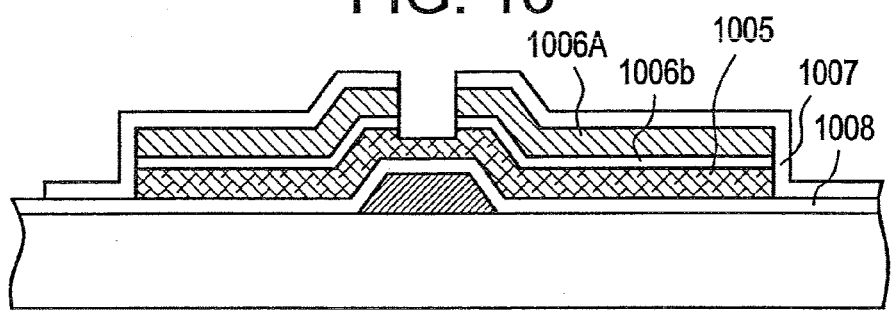
FIG. 16 is a cross-sectional view showing a thin film transistor (comparative example)
Figure 17:
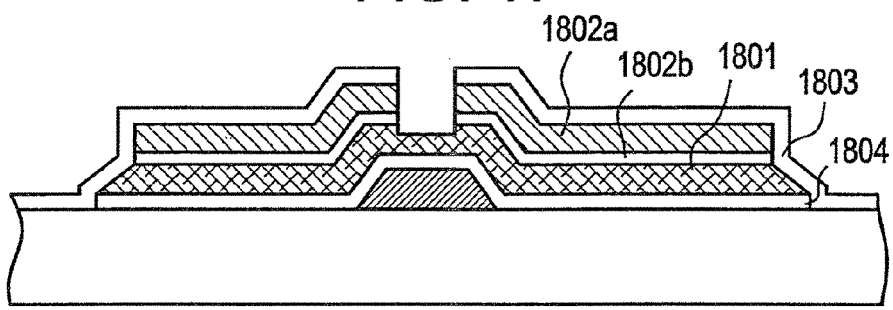
FIG. 17 is a cross-sectional view showing another thin-film transistor according to the present invention.
Figure 18:
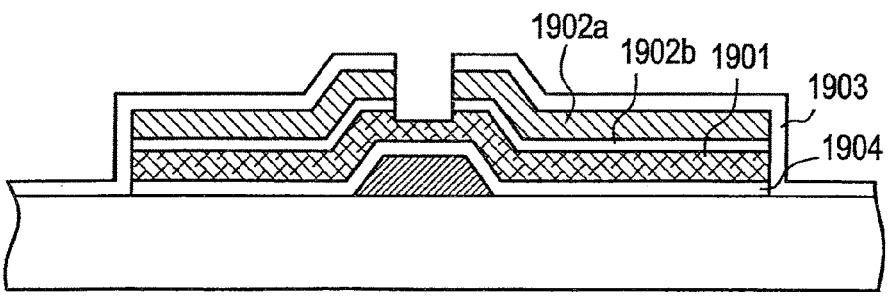
FIG. 18 is a cross-sectional view showing another thin film transistor (comparative example)
Figure 19A:
FIG. 19 is a cross-sectional SEM showing a thin film transistor according to the present invention.
Figure 19B:
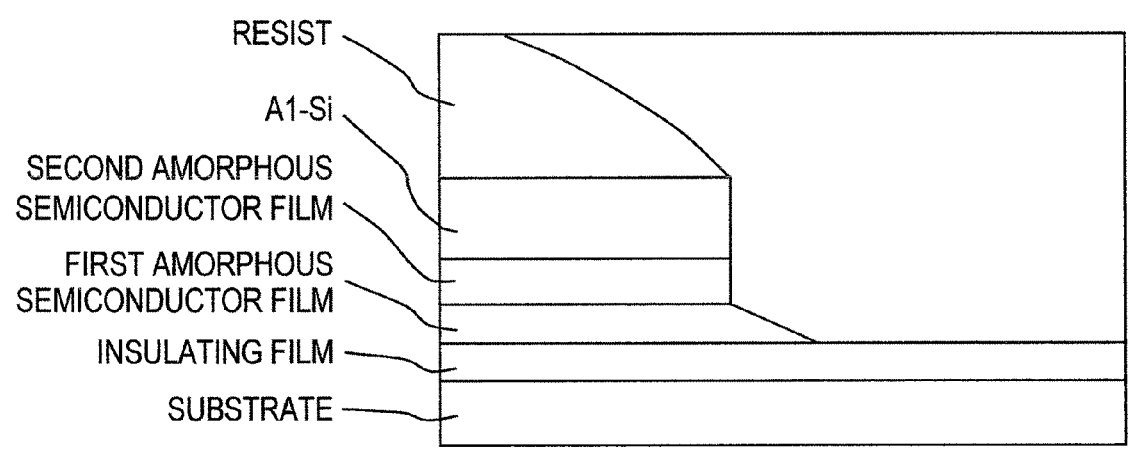
Figure 20A:
FIG. 20 is a cross-sectional SEM showing another thin film transistor according to the present invention.
Figure 20B:
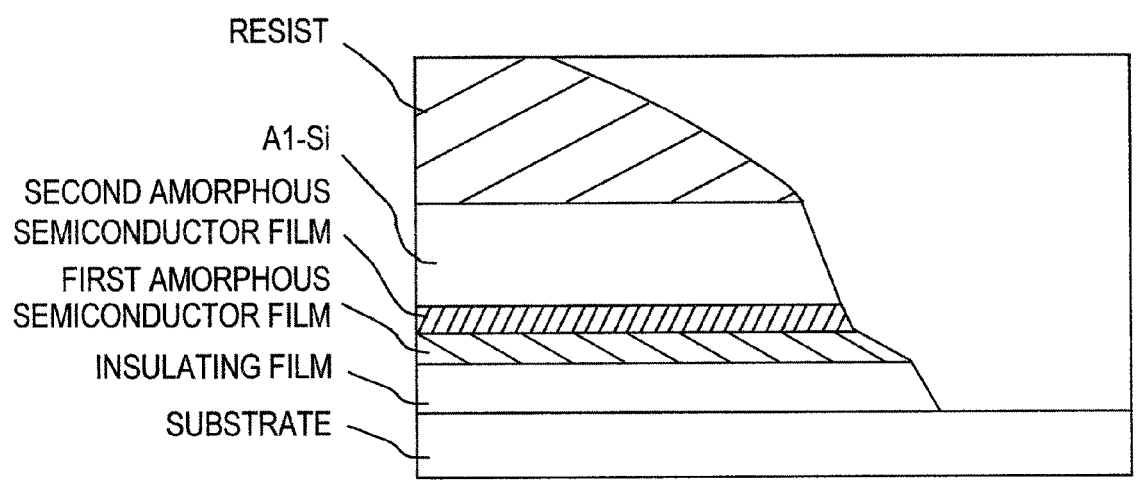
Figure 21A:
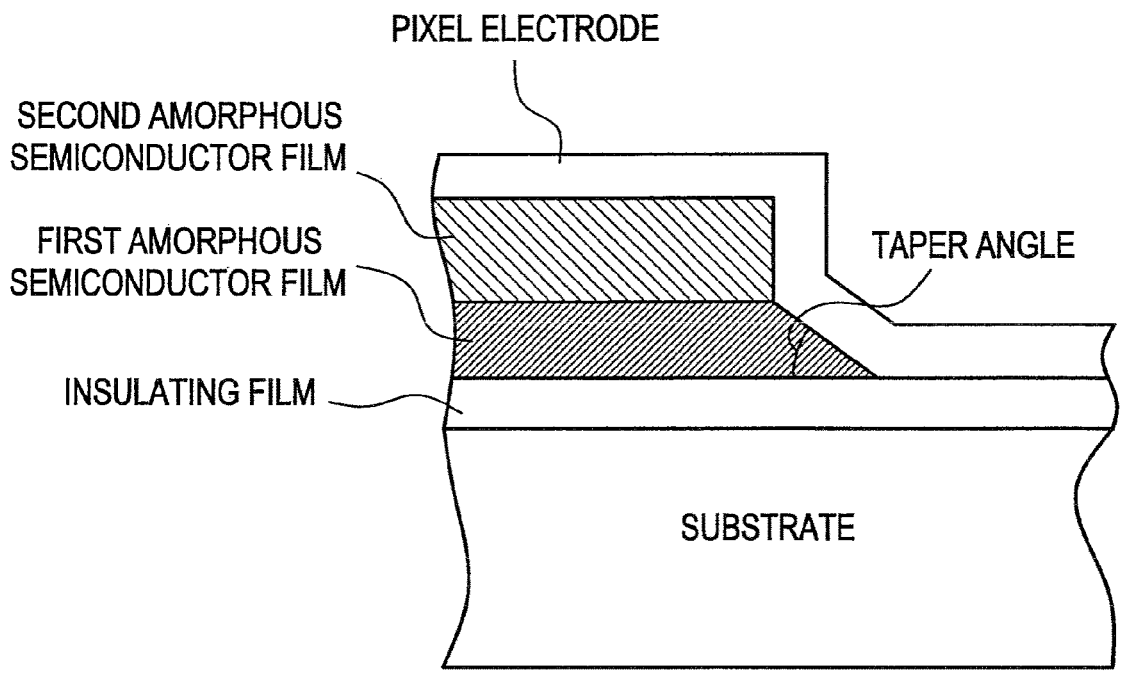
FIGS. 21A and 21B are diagrams for defining the taper angle.
Figure 21B:
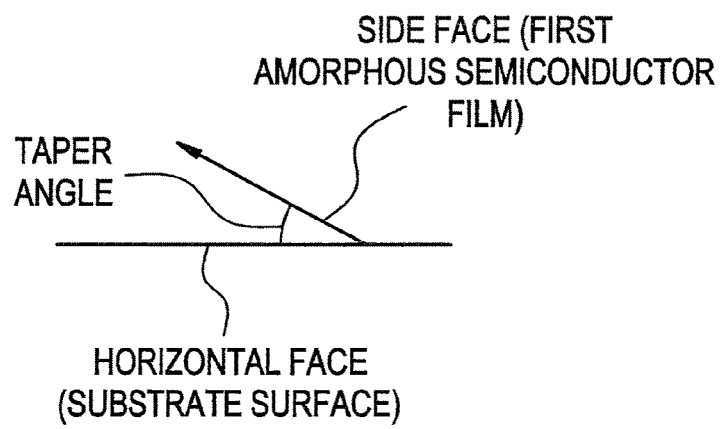
Figure 22A:
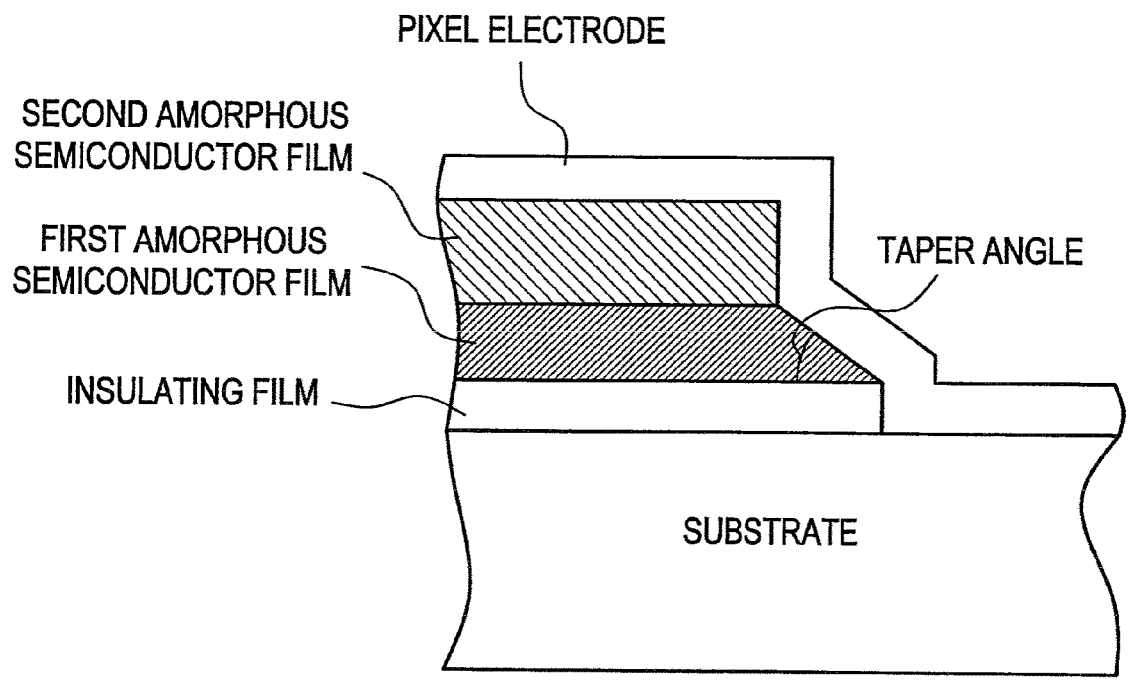
FIGS. 22A and 22B are another diagrams for defining the taper angle.
Figure 22B:
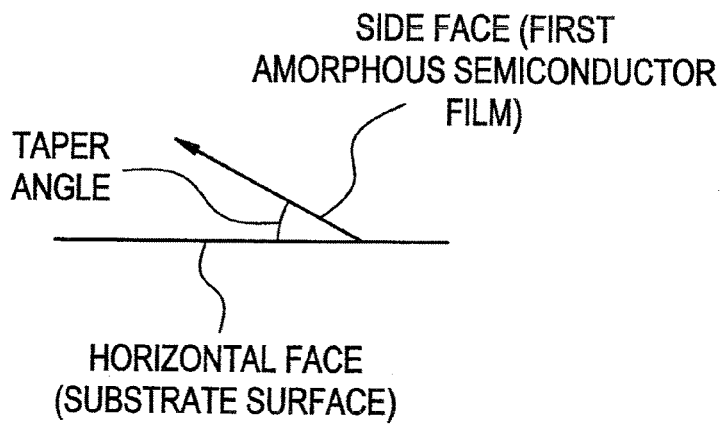

FIG. 14D illustrates a player utilizing a recording medium containing the recorded programs (hereinafter, simply referred to as a recording medium). This player includes a main body 816, a display section 817, a speaker section 818, a recording medium 819, and operation switches 820. This device uses a DVD (Digital Versatile Disc), a CD or the like as a recording medium to allow the music, the movies, the games and the Internet to be enjoyed.

As described above, the present invention has an extremely wide application, and thus is applicable to electronic devices of various fields. The electronic devices in Embodiment 5 can be realized with the structure obtained by any combination of Embodiment mode 1, Embodiment mode 2 or any combination of Embodiments 1 to 4.

According to the present invention, the conductive film and the second amorphous semiconductor film and the first amorphous semiconductor film can be removed with the same etching gas. Further, a TFT can be manufactured with three photomasks to realize improvement in productivity and yield.

Moreover, the ends of the first amorphous semiconductor film are tapered in the present invention. As a result, the problems of poor coverage of the pixel electrode can be solved.

What is claimed is:

1. A semiconductor device comprising:
   a gate wiring formed over an insulating surface;
   an insulating film formed over the gate wiring;
   a first semiconductor film formed over the insulating film;
   a source region and a drain region each provided in a second semiconductor film containing an impurity element of one conductivity type, formed over the first semiconductor film;
   a source wiring provided on the source region;
   an electrode provided on the drain region; and
   a pixel electrode formed so as to partially overlap and be in contact with the electrode,
   wherein at least an outer end of the first semiconductor film has a tapered shape,
   wherein an outer side edge of a top surface of the first semiconductor film is aligned with an outer side edge of a bottom surface of the second semiconductor film,
   wherein the first semiconductor film has a depression between the source region and the drain region, wherein an inner side edge of the top surface of the first semiconductor film is aligned with an inner side edge of the bottom surface of the second semiconductor film, and wherein a film thickness of the insulating film is thinner than a film thickness of the gate wiring.

2. The semiconductor device according to claim 1, wherein the taper angle of the outer end of the first semiconductor film is in the range of 5° to 45°.

3. The semiconductor device according to claim 1,
wherein at least an outer end of the second semiconductor film has a tapered shape, and
wherein a taper angle of the second semiconductor film is different from that of the first semiconductor film.

4. The semiconductor device according to claim 3, wherein the taper angle of the second semiconductor film is larger than that of the first semiconductor film.

5. The semiconductor device according to claim 1, wherein an outer side surface of the second semiconductor film is perpendicular to the insulating surface.

6. The semiconductor device according to claim 1, wherein a region of the first semiconductor film overlapping with the gate wiring and not overlapping with the source region or the drain region is thinner than another region of the first semiconductor film and is tapered to become thinner toward a center of the region.

7. The semiconductor device according to claim 1, wherein the first semiconductor film is one selected from the group consisting of an amorphous semiconductor film, a microcrystalline semiconductor film, and a compound semiconductor film with an amorphous structure.

8. The semiconductor device according to claim 1, wherein the second semiconductor film is an amorphous semiconductor film or a microcrystalline semiconductor film.

9. The semiconductor device according to claim 1, wherein the gate wiring contains a metal material selected from the group consisting of titanium, tantalum, tungsten, molybdenum, chromium, neodymium, aluminum, copper, silver, gold, and platinum.

10. The semiconductor device according to claim 1, wherein the source wiring and the electrode contains a metal material selected from the group consisting of aluminum, titanium, molybdenum, copper, tantalum, chromium, and nickel.

11. A semiconductor device comprising:
a gate wiring formed over an insulating surface;
an insulating film formed over the gate wiring;
a first semiconductor film formed over the insulating film;
a source region and a drain region each provided in a second semiconductor film containing an impurity element of one conductivity type, formed over the first semiconductor film;
a source wiring provided on the source region;
an electrode provided on the drain region; and
a pixel electrode formed so as to partially overlap and be in contact with the electrode,
wherein at least an outer end of the first semiconductor film has a tapered shape,
wherein an outer side edge of a top surface of the first semiconductor film is aligned with an outer side edge of a bottom surface of the second semiconductor film,
wherein the first semiconductor film has a depression between the source region and the drain region,
wherein an inner side edge of the top surface of the first semiconductor film is aligned with an inner side edge of the bottom surface of the second semiconductor film, and wherein a side surface of the depression is tapered.

12. The semiconductor device according to claim 11, wherein the taper angle of the outer end of the first semiconductor film is in the range of 5° to 45°.

13. The semiconductor device according to claim 11,
wherein at least an outer end of the second semiconductor film has a tapered shape, and
wherein a taper angle of the second semiconductor film is different from that of the first semiconductor film.

14. The semiconductor device according to claim 13, wherein the taper angle of the second semiconductor film is larger than that of the first semiconductor film.

15. The semiconductor device according to claim 11, wherein an outer side surface of the second semiconductor film is perpendicular to the insulating surface.

16. The semiconductor device according to claim 11, wherein a region of the first semiconductor film overlapping with the gate wiring and not overlapping with the source region or the drain region is thinner than another region of the first semiconductor film and is tapered to become thinner toward a center of the region.

17. The semiconductor device according to claim 11, wherein the first semiconductor film is one selected from the group consisting of an amorphous semiconductor film, a microcrystalline semiconductor film, and a compound semiconductor film with an amorphous structure.

18. The semiconductor device according to claim 11, wherein the second semiconductor film is an amorphous semiconductor film or a microcrystalline semiconductor film.

19. The semiconductor device according to claim 11, wherein the gate wiring contains a metal material selected from the group consisting of titanium, tantalum, tungsten, molybdenum, chromium, neodymium, aluminum, copper, silver, gold, and platinum.

20. The semiconductor device according to claim 11, wherein the source wiring and the electrode contains a metal material selected from the group consisting of aluminum, titanium, molybdenum, copper, tantalum, chromium, and nickel.

21. A semiconductor device comprising:
a gate wiring formed over an insulating surface;
an insulating film formed over the gate wiring;
a first semiconductor film formed over the insulating film;
a source region and a drain region each provided in a second semiconductor film containing an impurity element of one conductivity type, formed over the first semiconductor film;
a source wiring provided on the source region;
an electrode provided on the drain region; and
a pixel electrode formed so as to partially overlap and be in contact with the electrode,
wherein at least an outer end of the first semiconductor film has a tapered shape,
wherein an outer side edge of a top surface of the first semiconductor film is aligned with an outer side edge of a bottom surface of the second semiconductor film,
wherein the first semiconductor film has a depression between the source region and the drain region,
wherein an inner side edge of the top surface of the first semiconductor film is aligned with an inner side edge of the bottom surface of the second semiconductor film, wherein an inner side surface of the second semiconductor film and a side surface of the source wiring are perpendicular to the insulating surface, and wherein a side surface of the depression is tapered.

22. The semiconductor device according to claim 21, wherein the taper angle of the outer end of the first semiconductor film is in the range of 5° to 45°.

23. The semiconductor device according to claim 21, wherein at least an outer end of the second semiconductor film has a tapered shape, and wherein a taper angle of the second semiconductor film is different from that of the first semiconductor film.

24. The semiconductor device according to claim 23, wherein the taper angle of the second semiconductor film is larger than that of the first semiconductor film.

25. The semiconductor device according to claim 21, wherein an outer side surface of the second semiconductor film is perpendicular to the insulating surface.

26. The semiconductor device according to claim 21, wherein a region of the first semiconductor film overlapping with the gate wiring and not overlapping with the source region or the drain region is thinner than another region of the first semiconductor film and is tapered to become thinner toward a center of the region.

27. The semiconductor device according to claim 21, wherein the first semiconductor film is one selected from the group consisting of an amorphous semiconductor film, a microcrystalline semiconductor film, and a compound semiconductor film with an amorphous structure.

28. The semiconductor device according to claim 21, wherein the second semiconductor film is an amorphous semiconductor film or a microcrystalline semiconductor film.

29. The semiconductor device according to claim 21, wherein the gate wiring contains a metal material selected from the group consisting of titanium, tantalum, tungsten, molybdenum, chromium, neodymium, aluminum, copper, silver, gold, and platinum.

30. The semiconductor device according to claim 21, wherein the source wiring and the electrode contains a metal material selected from the group consisting of aluminum, titanium, molybdenum, copper, tantalum, chromium, and nickel.

* * * * *